(12) United States Patent
Arisawa

(10) Patent No.: US 9,709,690 B2
(45) Date of Patent: Jul. 18, 2017

(54) POWER RECEIVING DEVICE, ELECTRIC CIRCUIT, AND POWER SUPPLY DEVICE

(71) Applicant: SONY CORPORATION, Tokyo (JP)

(72) Inventor: Shigeru Arisawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 423 days.

(21) Appl. No.: 14/379,441

(22) PCT Filed: Jan. 28, 2013

(86) PCT No.: PCT/JP2013/051719
§ 371 (c)(1),
(2) Date: Aug. 18, 2014

(87) PCT Pub. No.: WO2013/145835
PCT Pub. Date: Oct. 3, 2013

(65) Prior Publication Data
US 2015/0028689 A1    Jan. 29, 2015

(30) Foreign Application Priority Data

Mar. 28, 2012 (JP) .................................. 2012-074537

(51) Int. Cl.
| | | |
|---|---|---|
| G01V 3/12 | (2006.01) | |
| H01F 38/14 | (2006.01) | |
| H01F 27/42 | (2006.01) | |
| H01F 37/00 | (2006.01) | |
| G01V 3/10 | (2006.01) | |
| G01R 19/00 | (2006.01) | |
| H02J 5/00 | (2016.01) | |
| H02J 7/02 | (2016.01) | |

(52) U.S. Cl.
CPC ........... *G01V 3/10* (2013.01); *G01R 19/0084* (2013.01); *G01V 3/101* (2013.01); *G01V 3/12* (2013.01); *H01F 38/14* (2013.01); *H02J 5/005* (2013.01); *H02J 7/025* (2013.01)

(58) Field of Classification Search
CPC . G01V 3/10; G01V 3/101; G01V 3/12; G01R 19/0084; H01F 38/14; H02J 5/005; H02J 7/025
USPC ......................................................... 307/104
See application file for complete search history.

(56) References Cited

U.S. PATENT DOCUMENTS

| | | | |
|---|---|---|---|
| 2005/0159906 A1 | 7/2005 | Tada | |
| 2012/0206132 A1* | 8/2012 | Lepage .............. | G01N 27/9033 324/239 |

FOREIGN PATENT DOCUMENTS

| | | |
|---|---|---|
| JP | 2002-272134 | 9/2002 |
| JP | 2005-202881 | 7/2005 |
| JP | 2006-230129 | 8/2006 |
| JP | 2010-252498 | 11/2010 |
| JP | 2012-16125 | 1/2012 |
| WO | WO 2012/002063 A1 | 1/2012 |

OTHER PUBLICATIONS

International Search Report issued Apr. 16, 2013 in PCT/JP2013/051719.

* cited by examiner

*Primary Examiner* — Hal Kaplan
(74) *Attorney, Agent, or Firm* — Chip Law Group

(57) ABSTRACT

Provided is a power receiving device including a power receiving coil which receives power supplied by electromagnetic waves, and a measurement coil which is disposed near the power receiving coil and measures an electromagnetic field.

20 Claims, 19 Drawing Sheets

POWER RECEIVING DEVICE, ELECTRIC CIRCUIT, AND POWER SUPPLY DEVICE

TECHNICAL FIELD

The present technique relates to a power receiving device, an electric circuit, and a power supply device. More specifically, the present technique relates to a power receiving device, an electric circuit, and a power supply device in a non-contact power supply system which supplies power without electrical contact.

BACKGROUND ART

Heretofore, the non-contact power supply system which supplies power without electrical contact has been provided with a circuit which detects matter mixed into a magnetic field between the power supply device and the power receiving device as foreign matter in some cases. This is because when foreign matter of a conductor is mixed into a magnetic field, an eddy current arises in the foreign matter, and then the foreign matter sometimes generates heat under the influence of Joule heat generated by the eddy current. When the amount of heat generation of the foreign matter is large, there has been a possibility that devices and cases in the non-contact power supply system have been damaged. Since the strength of the magnetic field output from the power supply device becomes high particularly in boosting charge, the amount of heat generation of the foreign matter also becomes large, and thus the presence of the foreign matter has posed a problem in many cases.

As the circuit which detects foreign matter, a circuit has been proposed which judges the presence or absence of foreign matter based on whether the amplitude of a voltage induced to the power reception side is less than the standard value, for example (Patent Literature 1.). When there is foreign matter, the loss of power occurs due to the eddy current of the foreign matter, which reduces the power transmission efficiency. Therefore, when the amplitude of the voltage on the power reception side decreases to be less than the standard value, it is judged that there is foreign matter.

CITATION LIST

Patent Literature

Patent Literature 1: JP 2012-16125A

SUMMARY OF INVENTION

Technical Problem

However, the above-described existing technique has not been able to correctly detect the presence of foreign matter in some cases. Specifically, the above-described power receiving device has sometimes erroneously detected foreign matter when the amplitude of the voltage of the power receiving coil has decreased due to causes other than the mixing of foreign matter. Although the decrease of the amplitude of the voltage occurred due to not only the mixing of foreign matter but a decrease of power supply and power supply efficiency or the like caused by a failure, deterioration with time, or the like of the power supply device, the above-described power receiving device has not acquired the power supply amount and the power transmission efficiency. Moreover, the above-described power receiving device has not assumed that the position of a power supply coil and the position of a power receiving coil shift from each other. Therefore, when the amplitude of the voltage has decreased, the power receiving device has not been able to judge that the decrease results from the mixing of foreign matter or the decrease of supplied power or power transmission efficiency. Moreover, when the amplitude of the voltage has decreased, the power receiving device has not been able to judge that the decrease results from the shift of the position of the supply coil and the position of the power receiving coil or the mixing of foreign matter. As a result, foreign matter has been erroneously detected when the amplitude of the voltage has decreased due to factors other than the mixing of foreign matter.

The present technique has been made in view of the above-described circumstances and aims at providing a power receiving device which can correctly detect foreign matter.

Solution to Problem

The present technology has been achieved in order to solve the above-mentioned problem, and the first aspect is to provide a power receiving device including a power receiving coil which receives power supplied by electromagnetic waves, and a measurement coil which is disposed near the power receiving coil and measures an electromagnetic field. This produces an effect that the electromagnetic field is measured.

In the first aspect, the measurement coil may be disposed in a manner that a same magnetic flux as a magnetic flux of the electromagnetic field passing through a coil surface of the power receiving coil passes. This produces an effect that when passing through the coil surface of the measurement coil, the same magnetic flux passes through the measurement coil.

In the first aspect, the measurement coil may be a coil in which a current does not substantially flow. This produces an effect that a current does not substantially flow in the measurement coil.

In the first aspect, a number of turns of the measurement coil may be different from a number of turns of the power receiving coil. This produces an effect that the number of turns of the measurement coil is different from that of the power receiving coil.

The first aspect may further include a voltage acquisition circuit which acquires an induced voltage of the measurement coil generated in the measured electromagnetic field, and a current acquisition circuit which acquires an induced current of the power receiving coil generated in the measured electromagnetic field. This produces an effect that the induced voltage and the induced current are acquired.

The first aspect may further include a detection circuit which detects presence or absence of foreign matter which hinders power reception by the electromagnetic waves from the induced voltage and the induced current. This produces an effect that the presence or absence of foreign matter is detected.

The first aspect may further include a charge control circuit which controls a charging current according to the foreign matter detection result. This produces an effect that a charging current is controlled according to the detection results of the foreign matter.

In the first aspect, the detection circuit may acquire a parameter fluctuating in the power receiving coil from the induced voltage and the induced current to thereby detect presence or absence of the foreign matter. The produces an effect that, by acquiring the parameter fluctuating in the power receiving coil, the presence or absence of foreign matter is detected.

In the first aspect, the parameter may be an impedance of the power receiving coil or an inductance of the power receiving coil. This produces an effect that, by acquiring the impedance of the power receiving coil or the inductance of the power receiving coil, the presence or absence of foreign matter is detected.

The first aspect may further include a transmitting circuit for transmitting a signal to a power supply device which supplies the power according to the induced voltage and the induced current. This produces an effect that the signal to the power supply device is transmitted according to the induced voltage and the induced current.

In the first aspect, the signal may be a signal which adjusts an amount of electromagnetic waves supplied from the power supply device. The produces an effect that the signal which adjusts the amount of electromagnetic waves is transmitted.

The first aspect may further include a load resistance acquisition circuit which acquires a resistance of a load connected to the power receiving coil, and a storage portion which stores the induced voltage, the induced current, and the resistance. This produces an effect that the parameter is acquired based on the ratio of the electromotive force.

In the first aspect, the detection circuit may further has a detection circuit which detects the presence or absence of foreign matter which hinders the power reception by the electromagnetic waves from the induced voltage of the measurement coil and the induced current of the power receiving coil. This produces an effect that the presence or absence of foreign matter is detected.

The first aspect may further include a charge control circuit which controls a charging current according to the foreign matter detection result. This produces an effect that the charging current is controlled according to the detection results of foreign matter.

In the first aspect, the detection circuit may acquire a parameter fluctuating in the power receiving coil from the induced voltage and the induced current to thereby detect presence or absence of the foreign matter. This produces an effect that, by acquiring the parameter fluctuating in the power receiving coil, the presence or absence of foreign matter is detected.

In the first aspect, the parameter may be an impedance of the power receiving coil or an inductance of the power receiving coil. This produces an effect that, by acquiring the impedance of the power receiving coil or the inductance of the power receiving coil, the presence or absence of foreign matter is detected.

The second aspect of the present technology is to provide an electric circuit for use in a power receiving device which receives power supplied by electromagnetic waves, the electric circuit including a power receiving coil which receives power supplied by the electromagnetic waves, and a measurement coil which is disposed near the power receiving coil. The electric circuit measures an induced voltage generated in the measurement coil. This produces an effect that the induced voltage generated in the measurement coil is measured.

In the second aspect, the measurement coil may be a coil in which a current does not substantially flow. This produces an effect that a current does not substantially flow in the measurement coil.

The third aspect of the present technology is to provide a power supply device, including a power supply coil which supplies power to a power receiving device according to a signal transmitted by the power receiving device, the power receiving device including a power receiving coil which receives power supplied by electromagnetic waves, a measurement coil which is disposed near the power receiving coil and in which a current does not substantially flow, a circuit which measures a voltage generated in the measurement coil, and a transmitting circuit for transmitting the signal for adjusting an electromagnetic wave amount according to the measured voltage. This produces an effect that power is supplied to the power receiving device according to the signal transmitted from the power receiving device.

In the third aspect, the measurement coil may be a coil in which a current does not substantially flow. This produces an effect that a current does not substantially flow in the measurement coil.

Advantageous Effects of Invention

The present technique can demonstrate an outstanding effect that the power receiving device can correctly detect foreign matter.

DESCRIPTION OF EMBODIMENTS

Hereinafter, aspects for carrying out the present technique (hereinafter referred to as "embodiments") are described. The description is given by the following order.

1. First embodiment (Example of detecting foreign matter based on change amount of resistance and inductance of power receiving coil)
2. Second embodiment (Example of detecting foreign matter based on change amount of resistance of power receiving coil)
3. Third embodiment (Example of detecting foreign matter and calculating control amount based on change amount of resistance of power receiving coil)
4. Fourth embodiment (Example of determining electromotive force ratio)
5. Fifth embodiment (Example of changing load resistance and detecting foreign matter)

<1. First Embodiment>
[Configuration Example of Non-contact Power Supply System]

Figure 1:
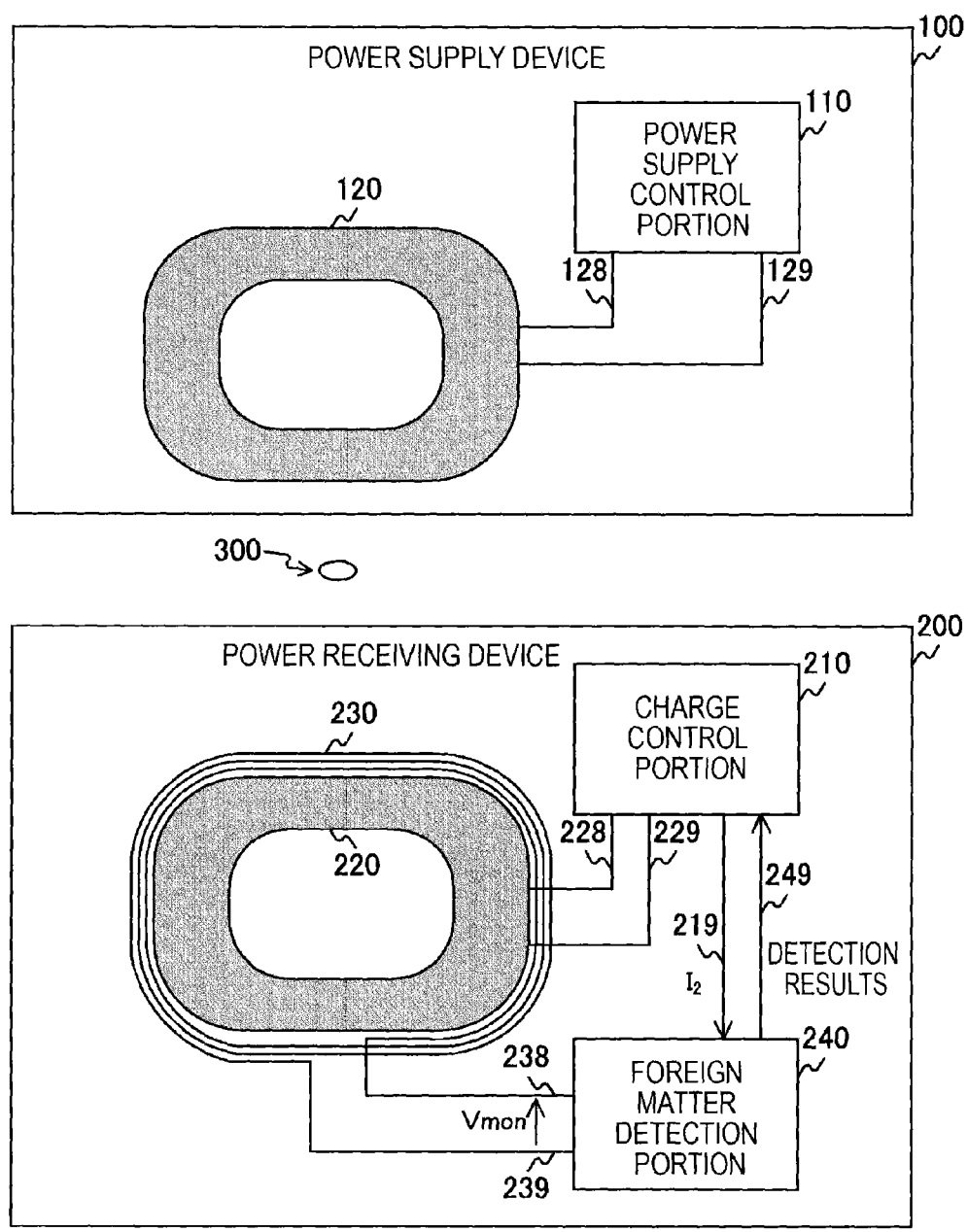
FIG. 1 is a general view illustrating one configuration example of a non-contact power supply system in First embodiment.

FIG. 1 is a general view illustrating one configuration example of a non-contact power supply system in this embodiment. The non-contact power supply system is a system for supplying power to a device without electrical contact. The non-contact power supply system has a power supply device 100 and a power receiving device 200.

The power supply device 100 supplies an alternating-current power to the power receiving device 200 by electromagnetic waves. The power supply device 100 has a power supply control portion 110 and a power supply coil 120.

The power supply control portion 110 controls the amount of power to be supplied to the power receiving device 200. The power supply control portion 110 supplies an alternating-current power to the power supply coil 120 through signal lines 128 and 129 and also controls the amount of the power. Moreover, the power supply control portion 110 receives a control signal for controlling the power supply amount from the power receiving device 200. When receiving the control signal, the power supply control portion 110 controls the power supply amount according to the control signal. The control signal includes a control signal requesting to stop the power supply, for example.

The power supply coil 120 generates electromagnetic waves according to the Ampere's law when power is supplied by the power supply control portion 110. The power is supplied to the power receiving device 200 through the electromagnetic waves.

The power receiving device 200 receives power supplied by the electromagnetic waves. The power receiving device 200 has a charge control portion 210, a power receiving coil 220, a measurement coil 230, and a foreign matter detection portion 240.

The charge control portion 210 charges the power received through wiring lines 228 and 229 from the power receiving coil 220 into a secondary battery and the like and also controls a current and a voltage during charging. Specifically, the charge control portion 210 converts the received alternating-current power to a direct-current power. The charge control portion 210 controls a voltage and a current based on the characteristics, charging time, and the like of the secondary battery.

The charge control portion 210 measures an induced current $I_2$ in the power receiving coil 220, and then supplies the measured value to the foreign matter detection portion 240 through a signal line 219. As the unit of the induced current $I_2$, an ampere (A) is used, for example. Furthermore, the charge control portion 210 receives the detection results in the detection of foreign matter from the foreign matter detection portion 240 through a signal line 249. Then, the charge control portion 210 transmits a control signal to the power supply device 100 based on the detection results. For example, when foreign matter is detected, the charge control portion 210 transmits a control signal requesting to stop the power supply. The charge control portion 210, when foreign matter is detected, can also transmit a control signal requesting to reduce the amount of power by a fixed amount. Thus, also in the detection of foreign matter, power is continuously supplied. The charge control portion 210 is one example of an electric circuit described in Claims.

When electromagnetic waves are supplied from the power supply coil 120, the power receiving coil 220 generates an induced voltage according to the changes in the magnetic flux of the electromagnetic waves according to the electromagnetic induction law.

The measurement coil 230 is a coil which is disposed near the power receiving coil 220 and measures the electromagnetic field. The measurement coil 230 is disposed in such a manner that the magnetic flux of the electromagnetic field passing through the measurement coil 230 is almost the same as the magnetic flux passing through the power receiving coil 220. Specifically, the measurement coil 230 is disposed in such a manner as to surround the power receiving coil 220, and the area of the coil surface of the power receiving coil 220 and the area of the coil surface of the measurement coil 230 are adjusted to be almost the same. In order to achieve the same coil surface area, the number of turns of the measurement coil 230 may be reduced to be smaller than that of the power receiving coil 220. Or, the diameter of the winding of the measurement coil 230 may be reduced to be smaller than that of the power receiving coil 220. A current is not substantially flown in the measurement coil 230. Herein, the description "current is not substantially flown" means that the terminals of the measurement coil 230 are opened, and thus a current does not flow in the measurement coil 230. Or, the description means that, also in the case where the terminals are not opened, only a slight amount of current flows even when a voltage generates due to the arrangement of a high resistance. To the opened terminals, the foreign matter detection portion 240 described later is connected through signal lines 238 and 239. By opening the terminals of the measurement coil 230, the magnetic field from the measurement coil 230 hardly acts on the power receiving coil 220. Thus, the power receiving device 200 can detect foreign matter without affecting the charge control portion 210. A high impedance resistance may be disposed between the terminals of the measurement coil 230 in place of opening the terminals.

Herein, an induced voltage V generated in the coil is proportional to the changes in the magnetic flux φ according to the following Expression 1 based on the Faraday's electromagnetic induction law. The unit of the magnetic flux is a weber (wb), for example, and the unit of the induced voltage V is a volt (V), for example.

[Math 1]

$$V = -N\frac{d\phi}{dt} \quad \text{Expression 1}$$

In Expression 1, N is the number of turns of the coil. t is time. The unit of t is second(s), for example.

When the magnetic flux passing through the measurement coil 230 and the magnetic flux passing through the power receiving coil 220 are almost in agreement with each other, the ratio between an induced voltage $V_{31}$ of the measurement coil 230 caused by the magnetic field from the power supply coil 120 and an induced voltage $V_{21}$ of the power receiving coil 220 is almost in agreement with the ratio of the number of turns of the coils from Expression 1. Therefore, when the ratio of the number of turns is known, the induced voltage $V_{21}$ of the power receiving coil 220 is correctly determined from the induced voltage $V_{31}$ of the measurement coil 230. However, an induced voltage Vmon of the measurement coil 230 includes not only the induced voltage $V_{31}$ caused by the magnetic field from the power supply coil 120 but an induced voltage $V_{32}$ caused by the magnetic field from the power receiving coil 220. Therefore, in order to obtain $V_{31}$, the calculation of $V_{32}$ is required besides the measurement of Vmon. The details of a method for calculating the induced voltage $V_{21}$ from $V_{32}$ and Vmon are described later.

It is difficult to directly measure the induced voltage $V_{21}$. This is because loads of the charge control portion 210 and the like are connected to the power receiving coil 220, and, under the influence thereof, the terminal voltage of the power receiving coil 220 does not serve as the induced voltage $V_{21}$. It is a matter of course that when the loads are removed, and then the terminals of the power receiving coil 220 are opened, only a value close to the induced voltage $V_{21}$ can be measured. However, unless the relationship with the induced current $I_2$ is known, the parameter of the power receiving coil 220 cannot be calculated. By providing the measurement coil 230, a correct induced voltage $V_{21}$ is determined from the induced voltage Vmon during charging.

The foreign matter detection portion 240 presumes the parameters fluctuating in the power receiving coil 220 from the induced voltage Vmon of the measurement coil 230 and the induced current $I_2$ of the power receiving coil 220 to thereby detect the presence or absence of foreign matter which hinders reception of electromagnetic waves. The parameters fluctuating in the power receiving coil 220 due to foreign matter include a resistance component, a reactance component, and the like in an impedance. The foreign matter detection portion 240 outputs the detection results of detecting the presence or absence of the foreign matter to the charge control portion 210 through the signal line 249.

Figure 2:
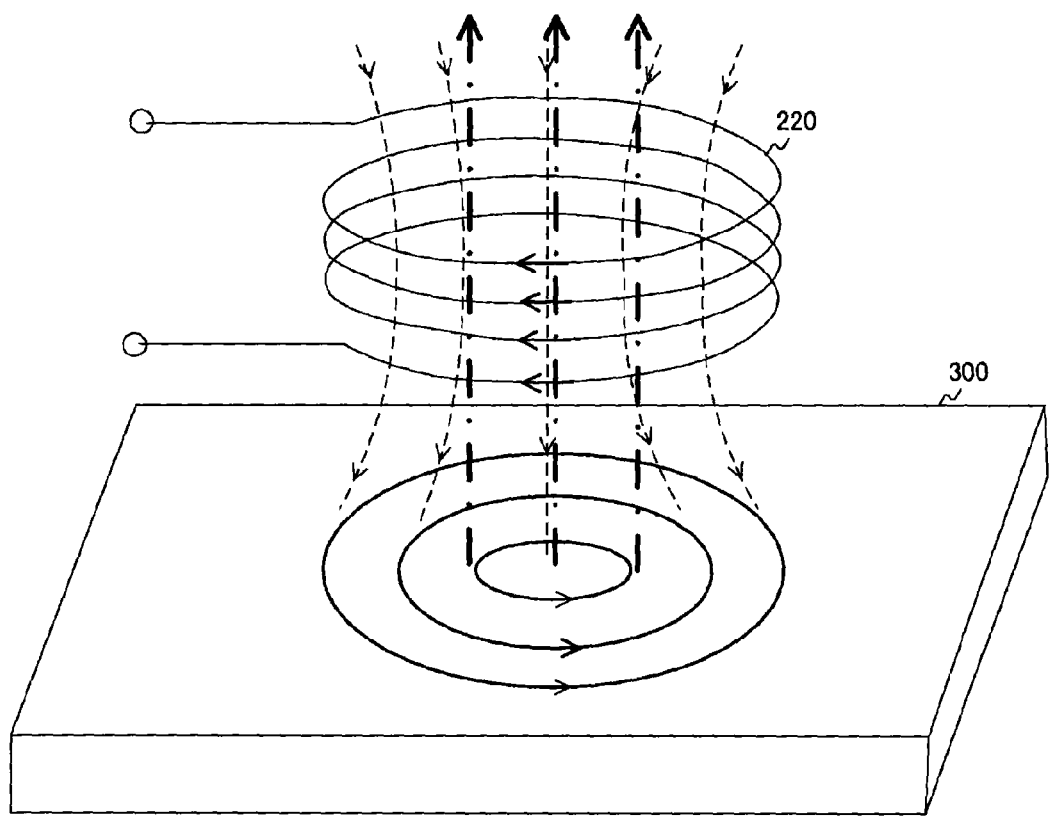
FIG. 2 is a view for explaining a cause of changes in parameters in a power receiving coil in First embodiment.

FIG. 2 is a view for explaining a cause of changes in the parameter in the power receiving coil 220 in First embodiment. A case is assumed in which conductive foreign matter 300, such as metal, is present in an electromagnetic field generated by the power receiving coil 220. When the electromagnetic field changes, an eddy current due to the electromagnetic induction effect generates in the foreign matter 300. The foreign matter generates heat due to the Joule heat generated by the eddy current. The magnetic field generated by the eddy current acts on the power receiving coil 220 to change the resistance and the reactance in an equivalent circuit of the power receiving coil 220. Therefore, the power receiving device 200 can judge the presence or absence of foreign matter from the change amount of the resistance and the reactance in the power receiving coil 220. In FIG. 2, the arrow indicated by the dotted lines represents the magnetic field generated by the power receiving coil 220 and the arrow indicated by the solid line represents the eddy current. The arrow indicated by the dashed lines represents the magnetic field generated by the eddy current.

Figure 3:
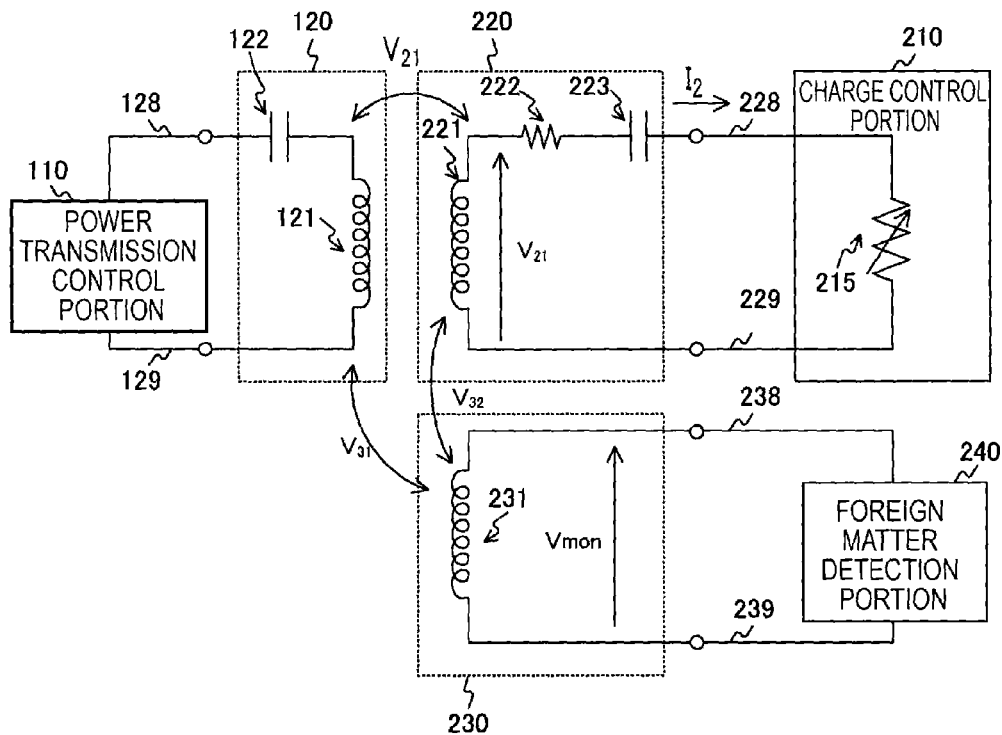
FIG. 3 is a circuit diagram illustrating one example of an equivalent circuit of the non-contact power supply system in First embodiment.

FIG. 3 is a circuit diagram illustrating one example of the equivalent circuit of the non-contact power supply system in First embodiment. The power supply coil 120 is replaced with an equivalent circuit containing a primary inductance ($L_1$) 121 and a primary capacitance ($C_1$) 122. The power receiving coil 220 is replaced with an equivalent circuit containing a secondary inductance ($L_2$) 221, a secondary resistance ($r_2$) 222, and a secondary capacitance ($C_2$) 223. The charge control portion 210 is replaced with an equivalent circuit containing a load resistance ($R_2$) 215. In the charge control portion 210, a rectifier is omitted. The measurement coil 230 is replaced with an equivalent circuit containing an inductance ($L_3$) 231. When foreign matter is present as described above, at least one of the secondary resistance $r_2$ and the secondary inductance $L_2$ changes in the equivalent circuit of the power receiving coil 220, and therefore foreign matter is detected from the change amount of the secondary resistance $r_2$ and the secondary inductance $L_2$. In the equivalent circuit, the resistance of the measurement coil 230 and the resistance of the power supply coil 120 are omitted.

In the equivalent circuit, an induced voltage generated in the secondary inductance 221 of the power receiving coil 220 by the magnetic field generated by the power supply coil 120 is $V_{21}$. An induced voltage generated in the measurement coil 230 by the magnetic field generated by the power supply coil 120 is $V_{31}$. On the other hand, an induced voltage generated in the measurement coil 230 by the magnetic field generated by the power receiving coil 220 is $V_{32}$. Therefore, the induced voltage in the measurement coil 230 is a voltage synthesized from the induced voltages $V_{31}$ and $V_{32}$. The foreign matter detection portion 240 acquires the induced voltage of the measurement coil 230 as the monitoring induced voltage Vmon. The charge control portion 210 acquires the induced current $I_2$ flowing in the power receiving coil 220.

[Configuration Example of Power Supply Control Portion]

Figure 4:
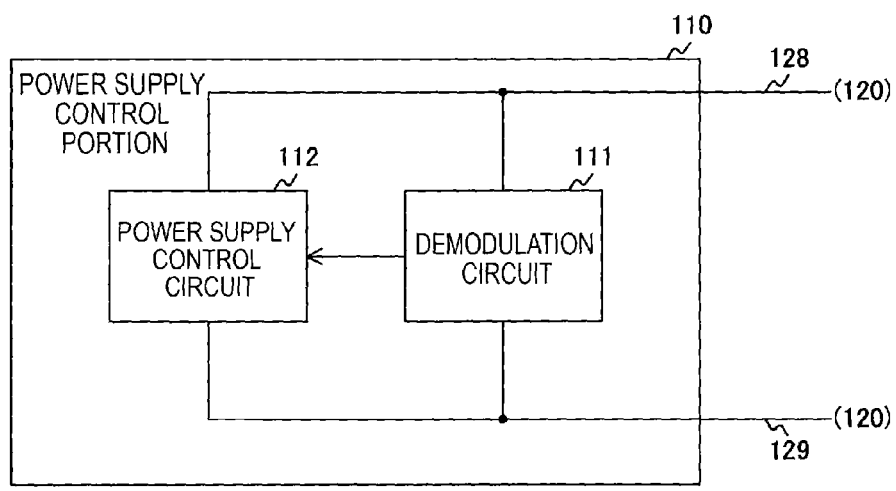
FIG. 4 is a block diagram illustrating one configuration example of a power supply control portion in First embodiment.

FIG. 4 is a block diagram illustrating one configuration example of the power supply control portion 110 in First embodiment. The power supply control portion 110 has a demodulation circuit 111 and a power supply control circuit 112.

The demodulation circuit 111 demodulates an alternating-current signal from the power receiving device 200 to extract a control signal superimposed on the alternating-current signal. The demodulation circuit 111 outputs the control signal to the power supply control circuit 112. The power supply control circuit 112 controls the amount of power to be supplied to the power receiving device 200 according to the control signal.

[Configuration Example of Charge Control Portion]

Figure 5:
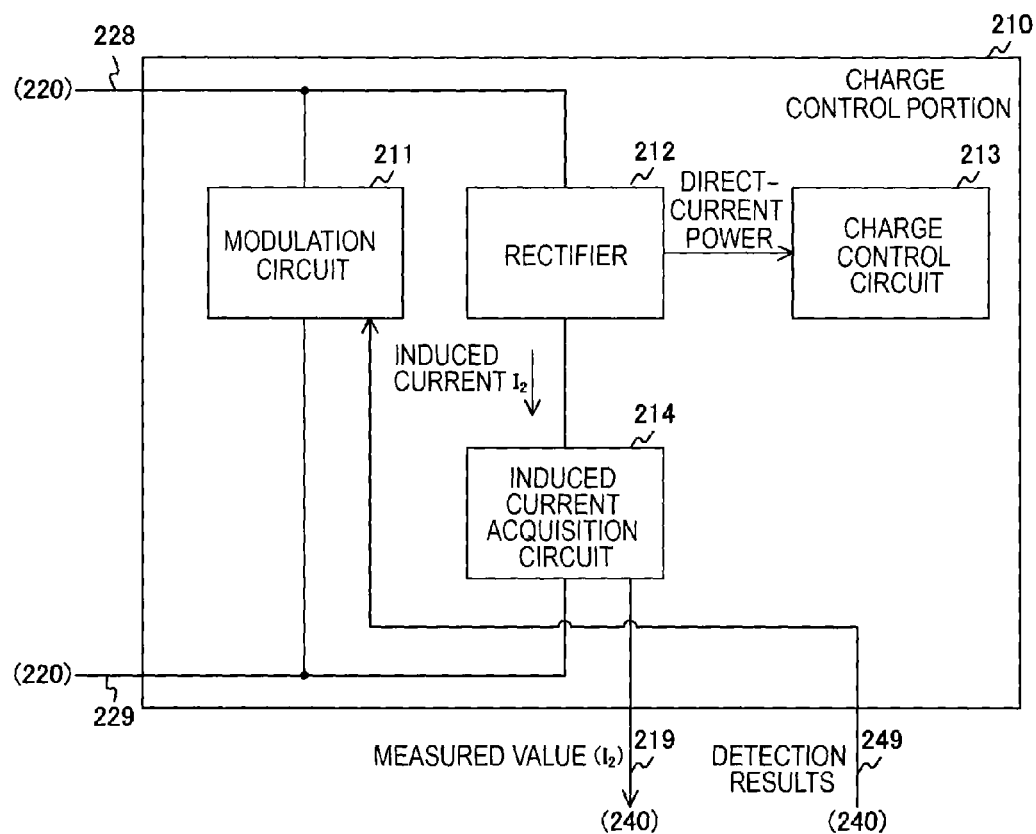
FIG. 5 is a block diagram illustrating one configuration example of a charge control portion in First embodiment.

FIG. 5 is a block diagram illustrating one configuration example of the charge control portion 210 in First embodiment. The charge control portion 210 has a modulation circuit 211, a rectifier 212, a charge control circuit 213, and an induced current acquisition circuit 214.

The modulation circuit 211 superimposes a control signal by modulating the amplitude and the like of an alternating-current signal to the power supply device 100. When receiving the detection results of notifying that foreign matter is detected from the foreign matter detection portion 240, the modulation circuit 211 superimposes a control signal requesting to stop the power supply, for example, on the alternating-current signal, and then transmits the control signal superimposed on the alternating-current signal to the power supply device 100. The modulation circuit 211 is one example of a transmitting circuit described in Claims.

The rectifier 212 converts an alternating-current power to a direct-current power, and then supplies the converted direct-current power to the charge control circuit 213. The charge control circuit 213 controls the voltage and the current of the converted direct-current power, and then charges a secondary battery and the like.

The induced current acquisition circuit 214 acquires the induced current $I_2$ flowing in the power receiving coil 220. The induced current acquisition circuit 214 measures the induced current $I_2$, A/D (Analog to Digital)-converts the measured value as required, and then supplies the A/D-converted value to the foreign matter detection portion 240. The induced current acquisition circuit 214 is one example of a current acquisition circuit described in Claims. Although the induced current acquisition circuit 214 acquires an alternating-current induced current, the induced current acquisition circuit 214 may acquire a direct-current induced current after converted by the rectifier 212 in place of the alternating-current induced current.

[Configuration Example of Foreign Matter Detection Portion]

Figure 6:
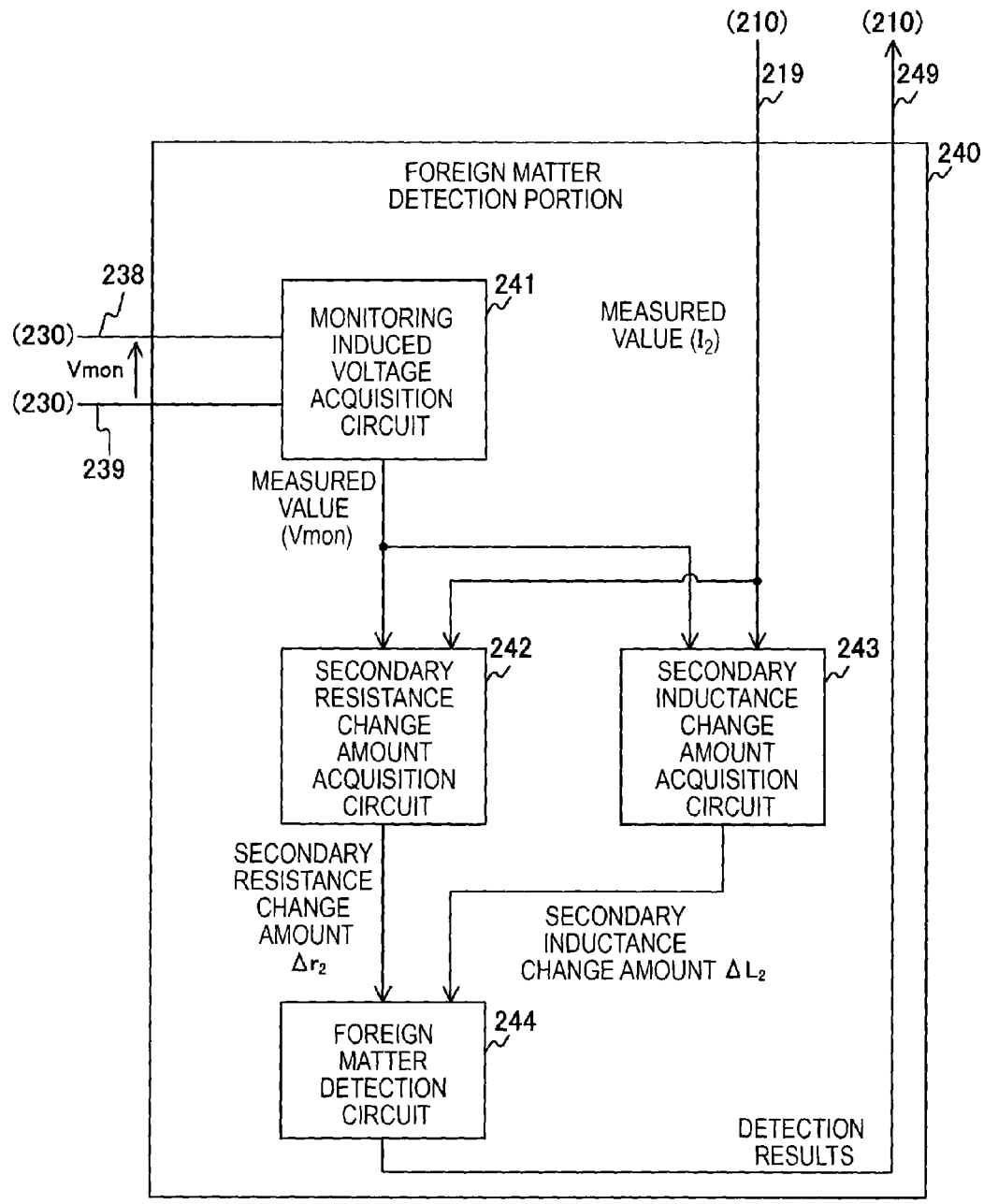
FIG. 6 is a block diagram illustrating one configuration example of a foreign matter detection portion in First embodiment.

FIG. 6 is a block diagram illustrating one configuration example of the foreign matter detection portion 240 in First embodiment. The foreign matter detection portion 240 has a monitoring induced voltage acquisition circuit 241, a secondary resistance change amount acquisition circuit 242, a secondary inductance change amount acquisition circuit 243, and a foreign matter detection circuit 244.

The monitoring induced voltage acquisition circuit 241 acquires a monitoring induced voltage Vmon in the measurement coil 230. For example, the monitoring induced voltage acquisition circuit 241 measures the monitoring induced voltage Vmon with an alternating-current voltmeter connected to the terminals of the measurement coil 230. The monitoring induced voltage acquisition circuit 241 A/D-converts the measured value of the monitoring induced voltage Vmon as required, and then supplied the A/D-converted value to the secondary resistance change amount acquisition circuit 242 and the secondary inductance change amount acquisition circuit 243. The monitoring induced voltage acquisition circuit 241 is one example of a voltage acquisition circuit described in Claims.

The secondary resistance change amount acquisition circuit 242 acquires the resistance change amount in the power receiving coil 220 as the secondary resistance change amount $\Delta r_2$ from the measured values of the monitoring induced voltage Vmon and the induced current $I_2$. The secondary resistance change amount acquisition circuit 242 calculates the secondary resistance $R_2$ using the following Expression 2, for example.

[Math 2]

$$r_2 = \text{Re}(\dot{V}_{21}/\dot{I}_2) - R_2$$
$$= \text{Re}\{(N_2/N_3) \times (\dot{V}_{mon}/\dot{I}_2)\} - R_2 \qquad \text{Expression 2}$$

In Expression 2, "Re( )" is a function which returns the real part of the complex number in ( ). $V_{21}$ is an alternating-current induced voltage generated in the power receiving coil 220 due to changes in the magnetic field generated by the power supply coil 120. The voltage V or the current I to the upper portion of which a dot is attached is an alternating-current voltage or an alternating-current expressed by the complex number. $R_2$ is a load resistance of a load in the charge control portion 210. The unit of the $R_2$ is an ohm ($\Omega$), for example. $N_2$ is the number of turns of the power receiving coil 220. $N_3$ is the number of turns of the measurement coil 230. A method for deriving Expression 2 is described later.

The secondary resistance change amount acquisition circuit 242 calculates the secondary resistance change amount $\Delta r_2$ from the calculated secondary resistance $r_2$ using the following Expression 3. The secondary resistance change amount acquisition circuit 242 outputs the calculated $\Delta r_2$ to the foreign matter detection circuit 244.

[Math 3]

$$\Delta r_2 = r_2 - r_0 \qquad \text{Expression 3}$$

In Expression 3, $r_0$ is the original secondary resistance of the power receiving coil 220 measured when there is no foreign matter.

The secondary inductance change amount acquisition circuit 243 acquires the inductance change amount in the equivalent circuit of the power receiving coil 220 as the secondary inductance change amount $\Delta L_2$ from the measured values of the monitoring induced voltage Vmon and the induced current $I_2$. The secondary inductance change amount acquisition circuit 243 calculates the secondary inductance $L_2$ using the following Expression 4, for example.

[Math 4]

$$L_2 = \frac{1}{\omega}\{\text{Im}(\dot{V}_{21}/\dot{I}_2) + 1/(\omega C_2)\} \qquad \text{Expression 4}$$
$$= \left(\frac{1}{\omega}\right)[(N_2/N_3)\{\text{Im}(\dot{V}_{mon}/\dot{I}_2) + \omega M_{32}\} + 1/(\omega C_2)]$$

In Expression 4, "Im( )" is a function which returns the imaginary part of the complex number in ( ). $\omega$ is the angular frequency and the unit is a radian/second (rad/s). $M_{32}$ is a coupling coefficient between the power receiving coil 220 and the measurement coil 230. $C_2$ is the capacitance in the equivalent circuit of the power receiving coil 220 and the unit is a Farhad (F), for example. A method for deriving Expression 4 is described later.

The secondary inductance change amount acquisition circuit 243 calculates the secondary inductance change amount $\Delta L_2$ from the calculated secondary inductance $L_2$ using the following Expression 5. The secondary resistance change amount acquisition circuit 242 outputs the calculated $\Delta L_2$ to the foreign matter detection circuit 244.

[Math 5]

$$\Delta L_2 = L_2 - L_0 \qquad \text{Expression 5}$$

In Expression 5, $L_0$ is the original inductance of the power receiving coil 220 measured when there is no foreign matter.

The foreign matter detection circuit 244 detects the presence or absence of foreign matter from the secondary resistance change amount $\Delta r_2$ and the secondary inductance change amount $\Delta L_2$. For example, the foreign matter detection circuit 244 compares $\Delta r_2$ and $\Delta L_2$ with threshold values Th1 and Th2. The threshold value Th1 is a threshold value for a comparison with $\Delta r_2$. The threshold value Th2 is a threshold value for a comparison with $\Delta L_2$. Then, the foreign matter detection circuit 244 judges that there is foreign matter when $\Delta r_2$ is equal to or higher than the threshold value Th1 or when $\Delta L_2$ is equal to or higher than the threshold value Th2 for example. The foreign matter detection circuit 244 outputs the detection results of foreign matter to the charge control portion 210. The foreign matter detection circuit 244 is one example of a detection circuit described in Claims.

The foreign matter detection portion 240 may judge that there is foreign matter when $\Delta r_2$ is equal to or higher than the threshold value Th1 and $\Delta L_2$ is equal to or higher than the threshold value Th2. The foreign matter detection portion 240 may judge that there is foreign matter when $\Delta L_2$ is not acquired and $\Delta r_2$ is equal to or higher than the threshold value as described later in Second embodiment. Or, the foreign matter detection portion 240 may judge that there is foreign matter when $\Delta r_2$ is not acquired and $\Delta L_2$ is equal to or higher than the threshold value. Or, the foreign matter detection portion 240 may judge that there is foreign matter when the additional value of $\Delta r_2$ and $\Delta \omega L_2$ is equal to or higher than the threshold value.

Herein, the values of $\Delta r_2$ and $\Delta L_2$ to the supplied voltage are different from each other depending on the size and the physical properties of foreign matter. Therefore, the type of the substance is specified based on these values. In particular, the temperature of the foreign matter increases as an increase in $\Delta r_2$, and therefore, by controlling the current to be received in such a manner that the temperature is less than a certain value, the temperature increase is suppressed.

Figure 7:
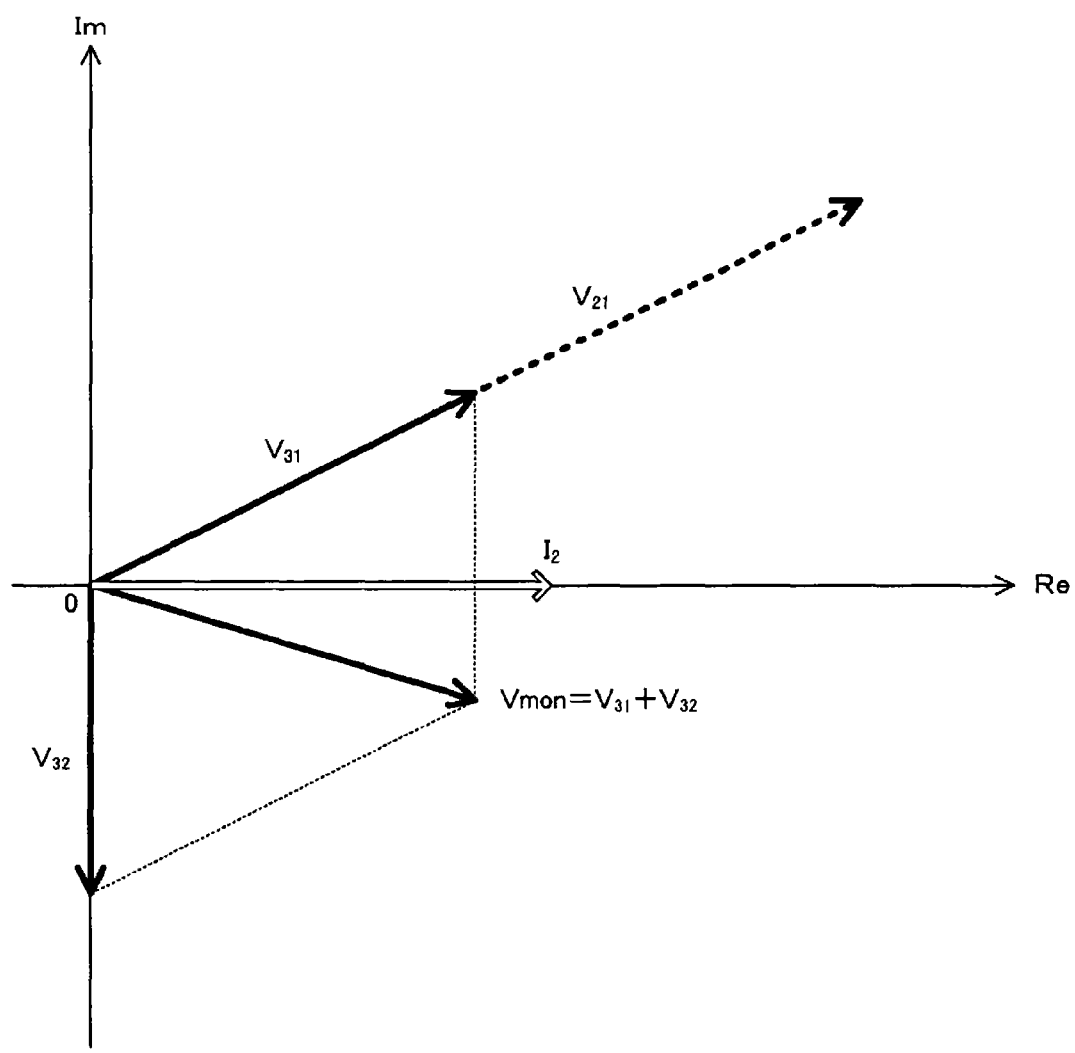
FIG. 7 is a view for explaining a method for calculating an induced voltage in First embodiment.

FIG. 7 is a view for explaining a method for calculating the induced voltage in First embodiment. In FIG. 7, the vertical axis represents the imaginary part of the alternating-current voltage expressed in a complex number and the horizontal axis represents the real part. From the equivalent circuit illustrated in FIG. 3, the induced voltage $V_{31}$ caused by changes in the magnetic field generated by the power supply coil 120 and the induced voltage $V_{32}$ caused by changes in the magnetic field generated by the power receiving coil 220 generate in the measurement coil 230. Therefore, the monitoring induced voltage Vmon is determined from the following Expression 6.

[Math 6]

$$\dot{V}_{mon} = \dot{V}_{31} + \dot{V}_{32} \qquad \text{Expression 6}$$

Herein, based on the coupling coefficient $M_{32}$ between the power receiving coil 220 and the measurement coil 230, the induced voltage $V_{32}$ is determined from the following Expression 7. In the calculation of $V_{32}$, the $M_{32}$ value measured in advance before the detection of foreign matter is used. In order to determine the $M_{32}$ value, in a state where the measurement coil 230 is mounted, the power supply from the power supply device 100 may be stopped, a current may be supplied to the power receiving coil 220 from the power supply in the power receiving device 200, and then Vmon may be measured. In this case, since only the induced voltage caused by a magnetic field from the power receiving coil 220 generates in the measurement coil 230, Vmon is equal to $V_{32}$. From the relationship between the current supplied to the power receiving coil 220 and Vmon (=$V_{32}$), $M_{32}$ is determined using Expression 7.

[Math 7]

$$\dot{V}_{32} = -j\omega \dot{I}_2 M_{32} \qquad \text{Expression 7}$$

The following Expression 8 is obtained from Expression 6 and Expression 7.

[Math 8]

$$\dot{V}_{31} = \dot{V}_{mon} + j\omega \dot{I}_2 M_{32} \qquad \text{Expression 8}$$

The induced voltage $V_{21}$ of the power receiving coil 220 is determined from the number of turns $N_2$ and the like of the coil by the following Expression 9.

[Math 9]

$$V_{21} = N_2 \frac{d}{dt} \int \int \mu \cdot H d_{21} \cdot n \cdot ds \qquad \text{Expression 9}$$

In Expression 9, $\mu$ is the magnetic permeability of the power receiving coil 220. $Hd_{21}$ is the strength of the magnetic field generating in the coil surface of the power receiving coil 220 and the unit is an ampere/meter (A/m), for example. n is a normal line vector.

On the other hand, the induced voltage $V_{31}$ of the measurement coil 230 is determined from the number of turns $N_3$ and the like of the coil by the following Expression 10.

[Math 10]

$$V_{31} = N_3 \frac{d}{dt} \int \int \mu \cdot H d_{31} \cdot n \cdot ds \qquad \text{Expression 10}$$

In Expression 10, $Hd_{31}$ is the strength of a magnetic field generating in the coil surface of the measurement coil 230.

As described above, the measurement coil 230 is disposed in such a manner as to surround the power receiving coil 220 and the number of turns of the measurement coil 230 is sufficiently small. Therefore, the area of the measurement coil 230 and the power receiving coil 220 and the strength of a magnetic field are almost equal. Therefore, the following Expression 11 is established.

[Math 11]

$$\frac{d}{dt} \int \int \mu \cdot H d_{21} \cdot n \cdot ds \approx \frac{d}{dt} \int \int \mu \cdot H d_{31} \cdot n \cdot ds \qquad \text{Expression 11}$$

Expression 11 shows that the magnetic flux passing through the measurement coil 230 and the magnetic flux passing through the power receiving coil 220 are almost in agreement with each other.

The following Expression 12 is obtained from Expression 9, Expression 10, and Expression 11.

[Math 12]

$$\dot{V}_{21} = (N_2/N_3) \times \dot{V}_{31} \qquad \text{Expression 12}$$

The following Expression 13 is obtained from Expression 8 and Expression 12.
[Math 13]

$$\dot{V}_{21}=(N_2/N_3)\times(\dot{V}_{mon}+j\omega\dot{I}_2 M_{32})  \quad \text{Expression 13}$$

The following Expression 14 is obtained from the equivalent circuit illustrated in FIG. 3.
[Math 14]

$$\dot{V}_{21}=(1/j\omega C_2+R_2+j\omega L_2+r_2)\cdot\dot{I}_2 \quad \text{Expression 14}$$

Expression 2 is derived by substituting the right side of Expression 13 into Expression 14 to determine the real part of both sides. Expression 4 is derived by substituting the right side of Expression 13 into Expression 14 to determine the imaginary part of both sides.

[Example of Operation of Power Supply Device]

Figure 8:
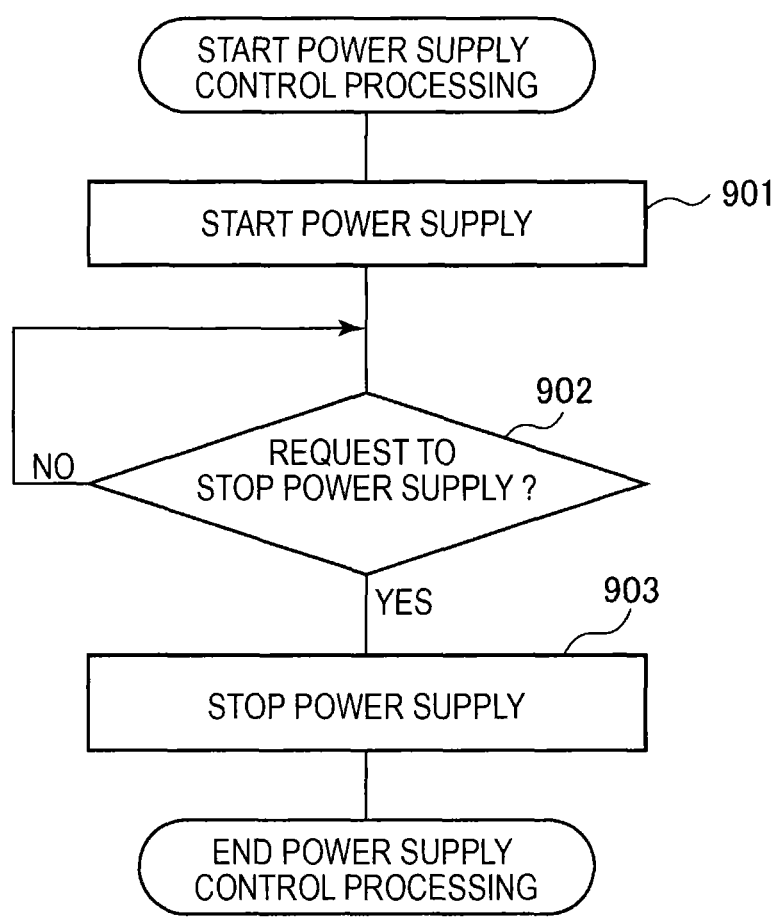
FIG. 8 is a flow chart illustrating one example of power supply control processing in First embodiment.

FIG. 8 is a flow chart showing one example of power supply control processing in First embodiment. The power supply control processing is started by the power supply device 100 when the power supply device 100 is turned ON, for example.

The power supply device 100 starts the power supply of an alternating-current power supply (Step S901). The power supply device 100 judges whether there is a request to stop the power supply based on a control signal (Step S902). When there is no request to stop the power supply (Step S902: No), the power supply device 100 returns to Step S902, and then continues the power supply. When there is the request to stop the power supply (Step S902: Yes), the power supply device 100 stops the power supply (Step S903). After Step S903, the power supply device 100 ends the power supply control processing.

[Example of Operation of Power Receiving Device]

Figure 9:
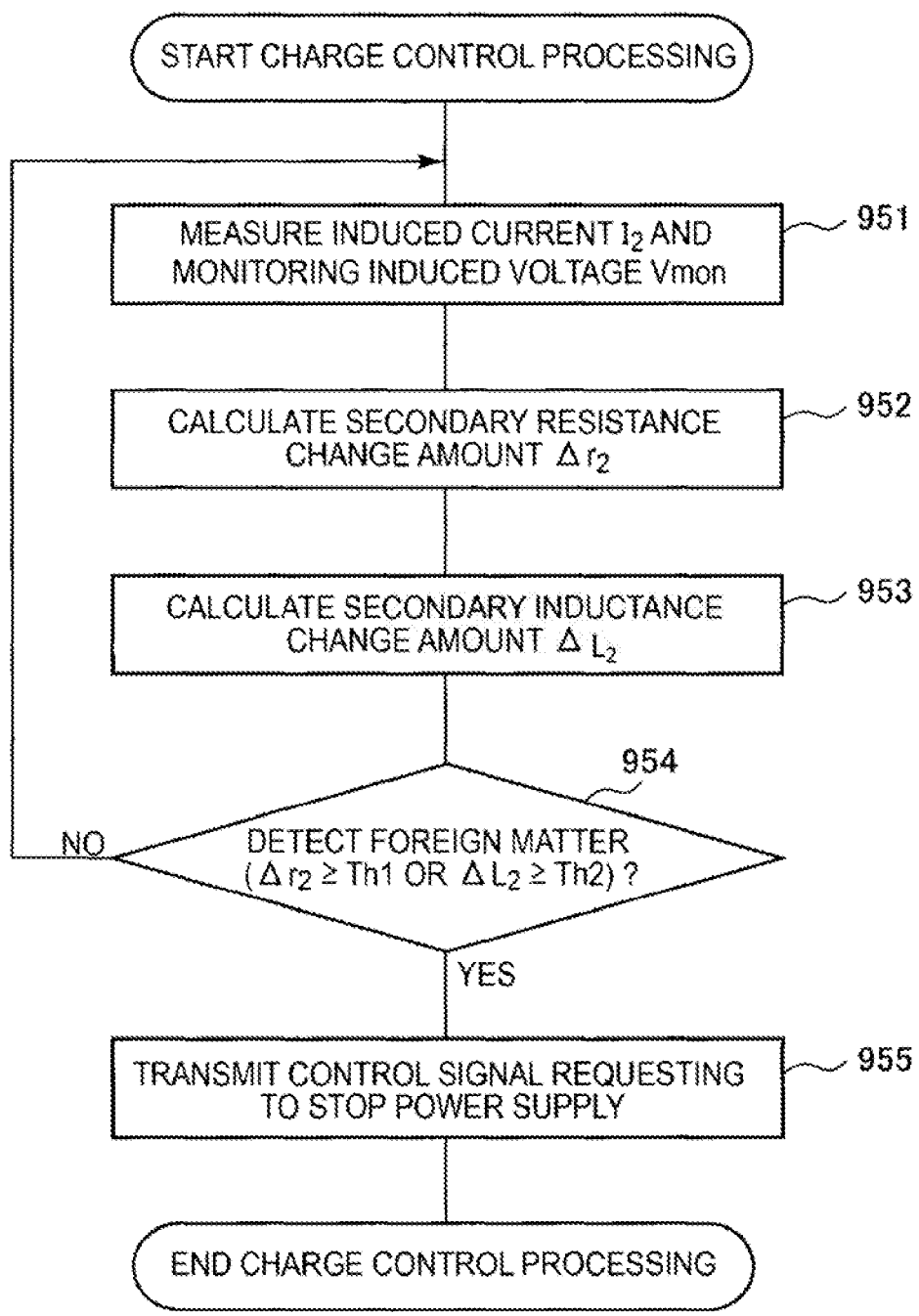
FIG. 9 is a flow chart illustrating one example of charge control processing in First embodiment.

FIG. 9 is a flow chart showing one example of charge control processing in First embodiment. The power supply control processing is started by the power receiving device 200 when the power supply is started from the power supply device 100, for example.

The power receiving device 200 measures the induced current $I_2$ and the monitoring induced voltage Vmon (Step S951). The power receiving device 200 substitutes the induced current $I_2$ and the monitoring induced voltage Vmon into Expression 2 and Expression 3 to calculate the secondary resistance change amount $\Delta r_2$ (Step S952). The power receiving device 200 substitutes the induced current $I_2$ and the monitoring induced voltage Vmon into Expression 4 and Expression 5 to calculate the secondary inductance change amount $\Delta L_2$ (Step S953).

The power receiving device 200 judges whether foreign matter is detected based on whether $\Delta r_2$ is equal to or higher than the threshold value Th1 or $\Delta L_2$ is equal to or higher than the threshold value Th2 (Step S954). When foreign matter is not detected (Step S954: No), the power receiving device 200 returns to Step S951. When foreign matter is detected, (Step S954: Yes), the power receiving device 200 transmits a control signal requesting to stop the power supply to the power supply device 100 (Step S955). After Step S955, the power receiving device 200 ends the charge control processing. The power receiving device 200 may control (stop or the like) the supply of a charging current to a secondary battery and the like when foreign matter is detected. In this case, the power receiving device 200 may not transmit a control signal to the power supply device 100 when foreign matter is detected. The power receiving device 200 may control the supply of a charging current and also transmit a control signal to the power supply device 100 when foreign matter is detected.

Figure 10:
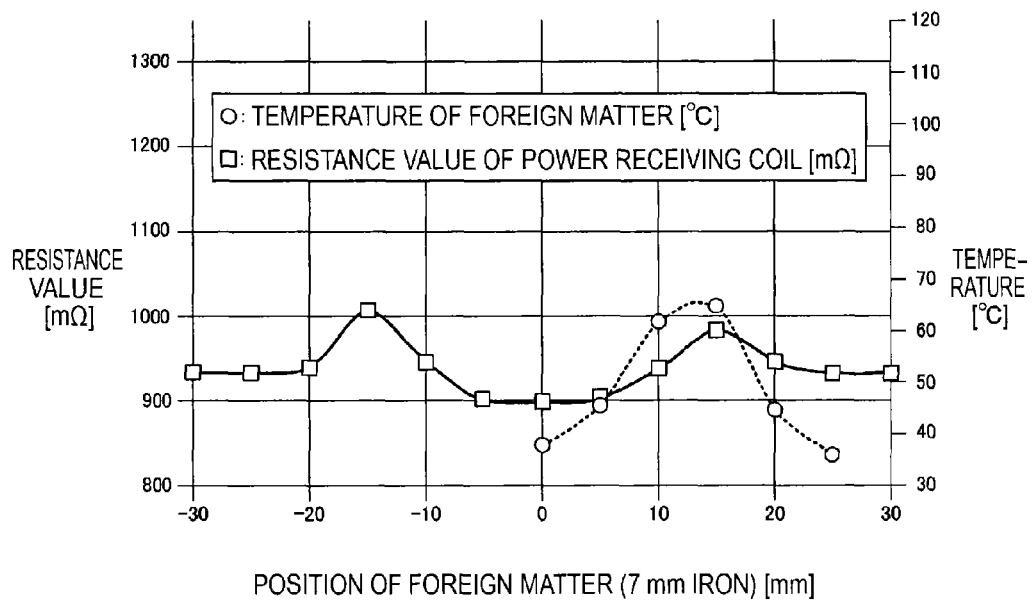
FIG. 10 is a graph showing one example of the relationship between the temperature of 7 mm iron and a resistance value of the power receiving coil in First embodiment.
Figure 11:
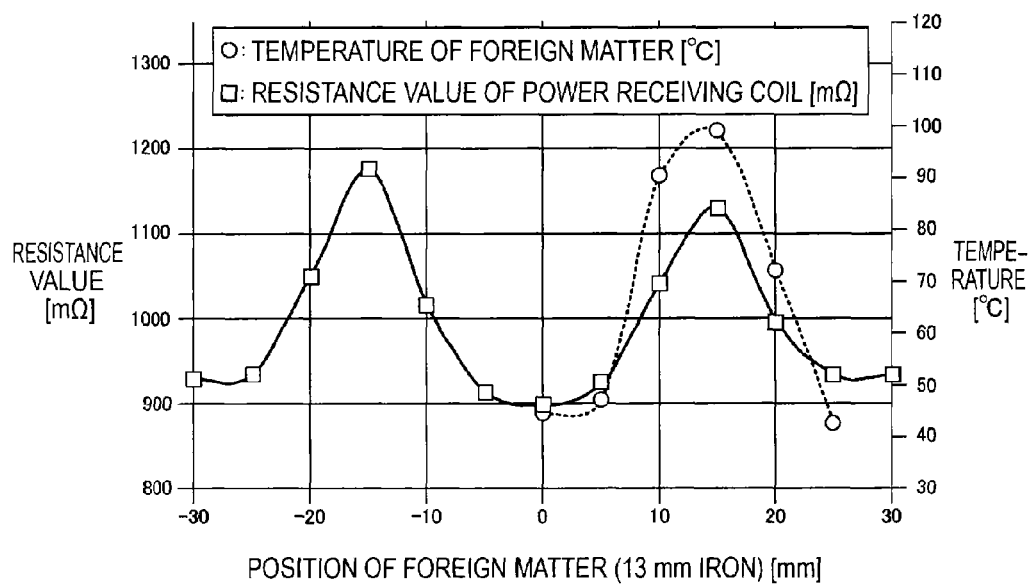
FIG. 11 is a graph showing one example of the relationship between the temperature of 13 mm iron and a resistance value of the power receiving coil in First embodiment.
Figure 12:
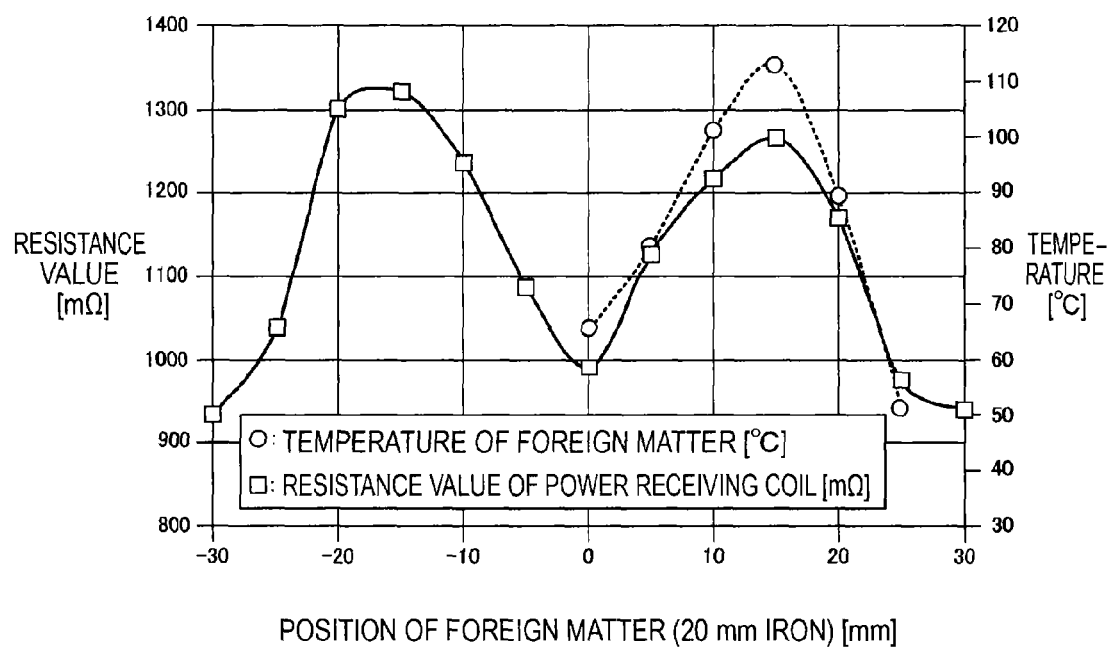
FIG. 12 is a graph showing one example of the relationship between the temperature of 20 mm iron and a resistance value of the power receiving coil in First embodiment.

FIG. 10 to FIG. 12 are graphs showing one example of the relationship between the temperature of foreign matter and the resistance value of the coil in First embodiment. The vertical axis of each of FIG. 10 to FIG. 12 represents temperature of foreign matter or the resistance value of the coil and the horizontal axis represents the position of the foreign matter. The unit of the temperature is a degree Celsius (° C.) and the unit of the resistance value is a milliohm (mΩ). The unit of the position is a millimeter (mm). In the horizontal axis, the position on a predetermined straight line including the center of the coil as the origin and parallel to the coil surface is measured as the position of the foreign matter. In FIG. 10 to FIG. 12, the circle marks plot the measurement results of the temperature of the foreign matter and the square marks plot the measurement results of the resistance value of the power receiving coil 220. In FIG. 10 to FIG. 12, the triangle marks plot the measurement results of the resistance value of the power supply coil 120.

As shown in FIG. 10 to FIG. 12, when the foreign matter is placed on a position slightly separated from the center of the coil, the temperature of the foreign matter becomes high and the resistance value of the coils (120 and 220) also rises. On the other hand, when the foreign matter is placed near the center, the temperature of the foreign matter becomes low and the resistance value of the coil also becomes low. This is because Joule heat generates due to an eddy current in the foreign matter and also the parameters, such as the resistance value of the coil, change due to the action of a magnetic field generated by the eddy current as described above.

In FIG. 10 to FIG. 12, the temperature when the position is expressed as a negative number is not measured. This is because it is presumed that the temperature changes in the case where the position is expressed as a negative number are the same as those in the case where the position is expressed as a positive number.

Thus, according to First embodiment of the present technique, the power receiving device 200 can measure the electromagnetic field with the measurement coil 230 disposed near the power receiving coil 220. Therefore, the power receiving device 200 acquires the parameters (resistance and inductance) fluctuating due to the presence of foreign matter from the induced voltage of the measurement coil 230 generated by the electromagnetic field and the induced current of the power receiving coil 220 to thereby detect the presence or absence of foreign matter. The values of the resistance and the inductance of the power receiving coil 220 are constant irrespective of the power supply efficiency when there is no foreign matter but fluctuate when foreign matter is mixed between the coils. Therefore, foreign matter is correctly detected from the change amount of the resistance and the inductance.

The non-contact power supply system in First embodiment supplies power using the power supply coil 120 and the power receiving coil 220 and also transmits and receives a control signal. However, it may be configured so that a coil for transmitting and receiving a control signal is separately provided from the power supply coil 120 and the power receiving coil 220 in the non-contact power supply system, and then the power supply device 100 and the power receiving device 200 transmit and receive a control signal using the coil.

<2. Second Embodiment>
[Configuration Example of Foreign Matter Detection Portion]

Figure 13:
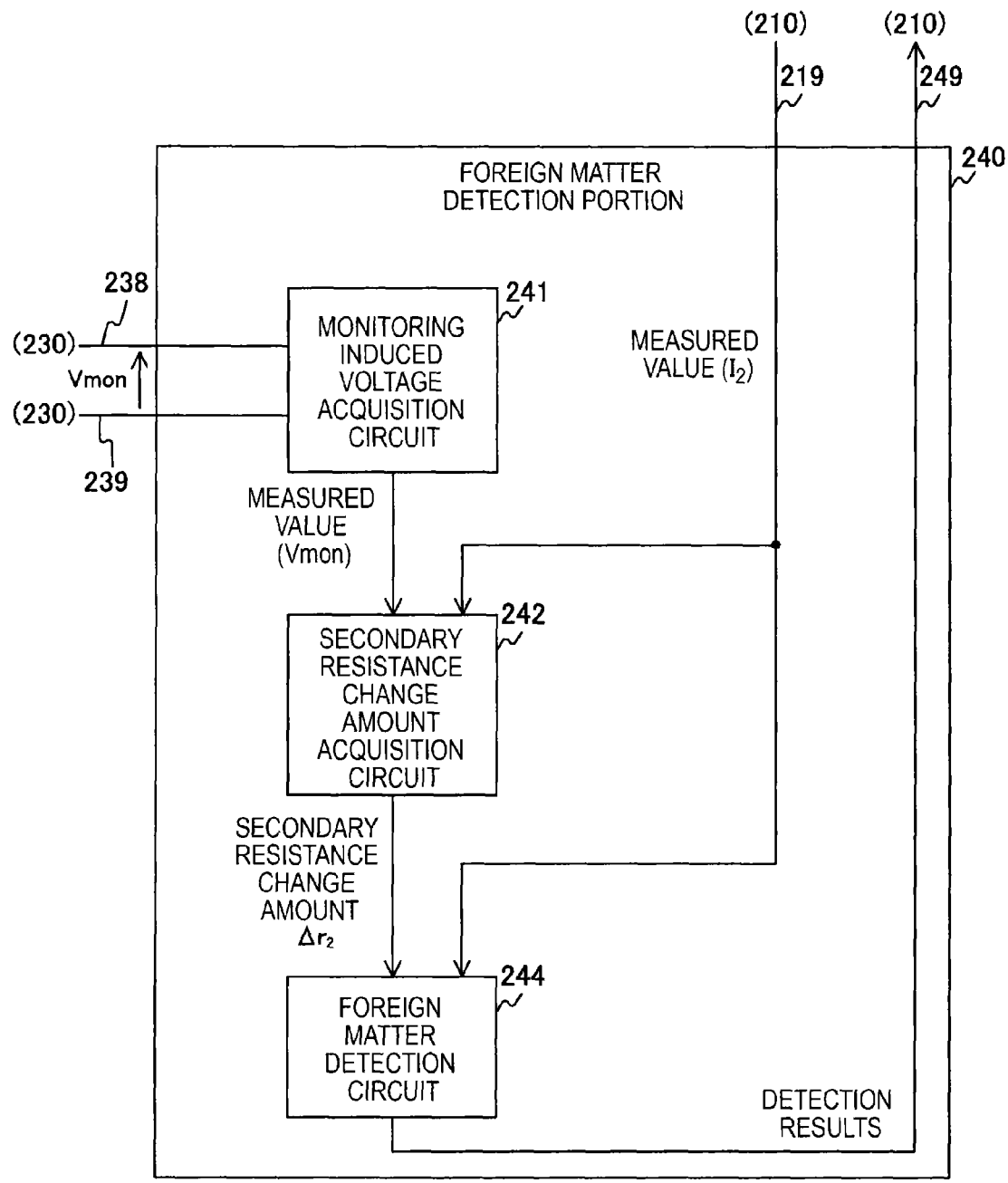
FIG. 13 is a block diagram illustrating one configuration example of a foreign matter detection portion in Second embodiment.

FIG. 13 is a block diagram illustrating one configuration example of a foreign matter detection portion 240 in Second embodiment. The foreign matter detection portion 240 of Second embodiment is different from that of First embodiment in that the foreign matter detection portion 240 of Second embodiment does not acquire $\Delta L_2$ and detects the presence or absence of foreign matter only from $\Delta r_2$. Specifically, the foreign matter detection portion 240 of Second embodiment is different from that of First embodiment in that the foreign matter detection portion 240 of Second embodiment does not have a secondary inductance change amount acquisition circuit 243.

A foreign matter detection circuit 244 of Second embodiment detects foreign matter from the secondary resistance change amount $\Delta r_2$ and an induced current $I_2$. For example, the foreign matter detection circuit 244 calculates $\Delta r_2 \times I_2 \times I_2$, and then judges that there is foreign matter when the calculated value is equal to or higher than a threshold value Th1'. This is because the amount of heat of Joule heat caused by an eddy current is proportional to $\Delta r_2 \times I_2 \times I_2$.

[Example of Operation of Power Receiving Device]

Figure 14:
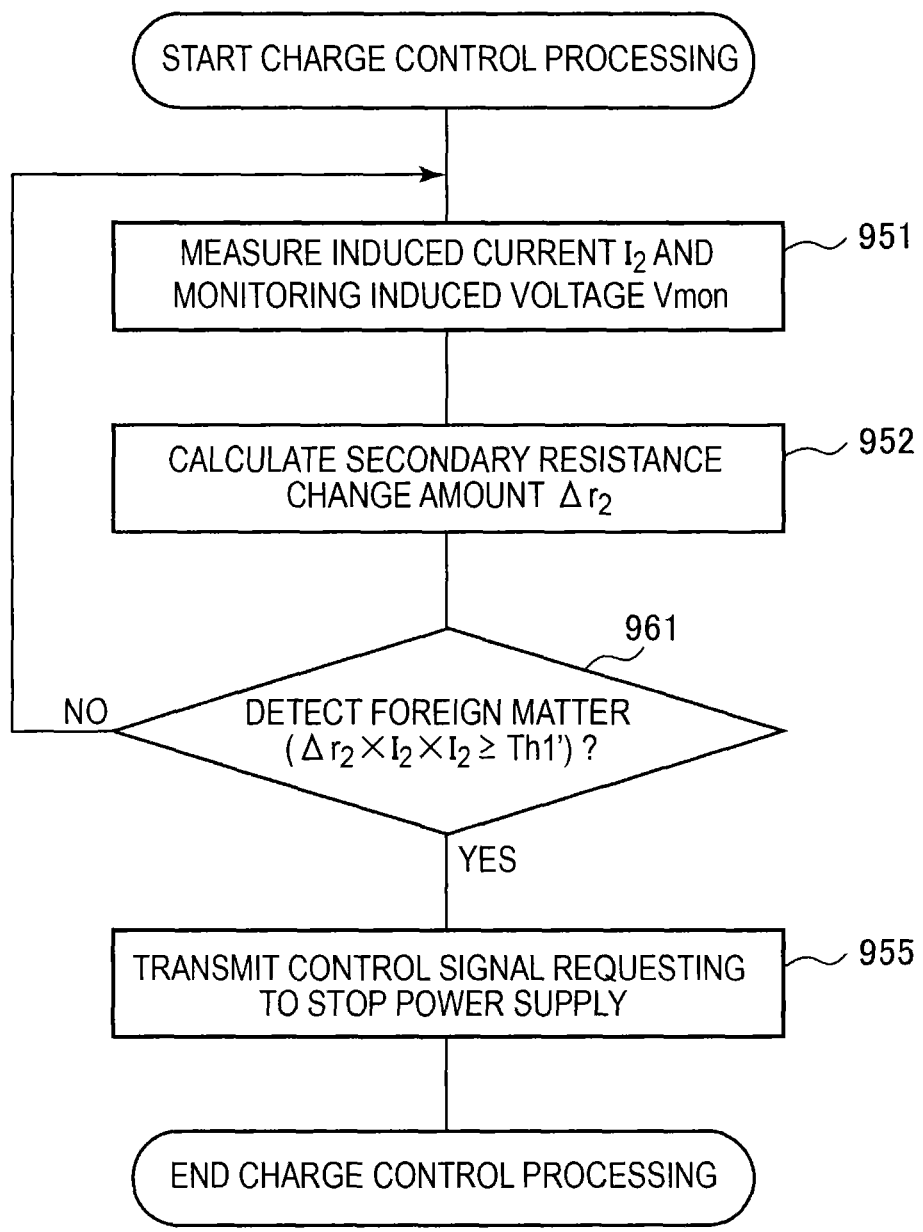
FIG. 14 is a flow chart illustrating one example of charge control processing in Second embodiment.

FIG. 14 is a flow chart showing one example of charge control processing in Second embodiment. The charge control processing of Second embodiment is different from that of First embodiment in that Step S961 is carried out instead of Steps S953 and S954.

The power receiving device 200 judges whether foreign matter is detected based on whether $\Delta r_2 \times I_2 \times I_2$ is equal to or higher than the threshold value Th1' (Step S961) after the calculation of the secondary resistance change amount $\Delta r_2$ (Step S952). When foreign matter is not detected (Step S961: No), the power receiving device 200 returns to Step S951. When foreign matter is detected (Step S961: Yes), the power receiving device 200 transmits a control signal requesting to stop the power supply to a power supply device 100 (Step S955).

Thus, according to Second embodiment of the present technique, the power receiving device 200 can detect foreign matter, which may generate heat, from the secondary resistance change amount $\Delta r_2$ and the induced current $I_2$. Therefore, the non-contact power supply system can prevent the generation of heat of foreign matter by controlling the power supply amount when foreign matter is detected.

<3. Third Embodiment>

Figure 15:
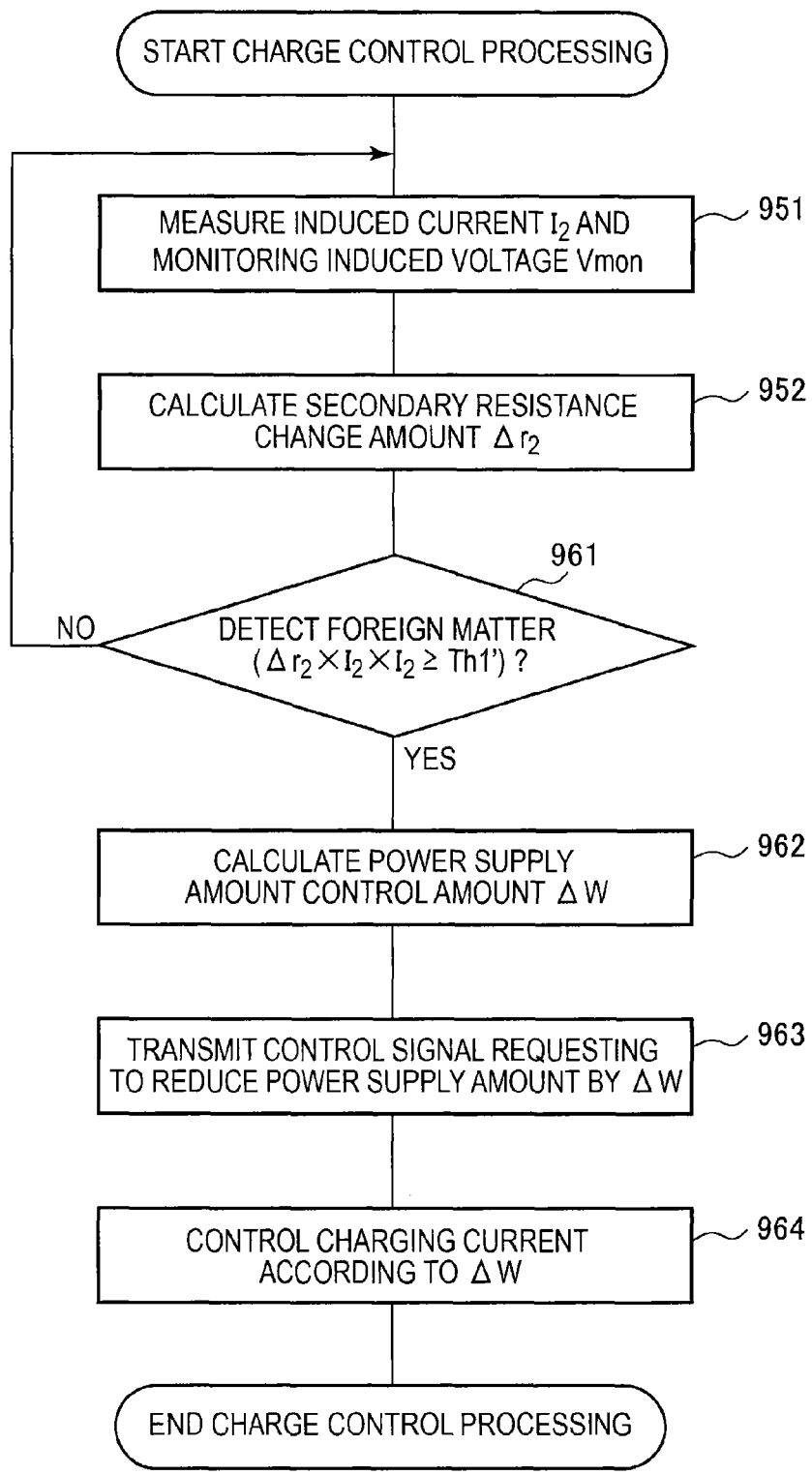
FIG. 15 is a flow chart illustrating one example of charge control processing in Third embodiment.

FIG. 15 is a flow chart showing one example of charge control processing in Third embodiment. The charge control processing of Third embodiment is different from that of Second embodiment in that the control amount of the power supply amount is further calculated when foreign matter is detected. The configuration of a foreign matter detection portion 240 of Third embodiment is the same as that of Second embodiment. However, a foreign matter detection circuit 244 of Third embodiment calculates a control amount $\Delta W$ of the power supply amount when foreign matter is detected. A charge control portion 210 of Third embodiment controls a charging current according to $\Delta W$.

Herein, the temperature increase amount $\Delta T$ of foreign matter is generally determined from a heat resistance $R_t$ of foreign matter by the following Expression 15. The unit of $R_t$ is a degree Celsius/watt (° C./W), for example.

[Math 15]

$$\Delta T \approx \Delta r_2 \times I_2 \times I_2 / R_t \qquad \text{Expression 15}$$

In Expression 15, $I_2$ to which a dot is not attached represents the absolute value of an alternating-current induced current $I_2$.

In Expression 15, a value of the induced current of the power receiving coil 220 in the case of $\Delta T$ at which devices are not damaged and the like is set to $I_{2L}$. A power supply $W_{1L}$ required for generating $I_{2L}$ is calculated from the following Expression 16 when the supply efficiency is set to $\eta$.

[Math 16]

$$W_{1L} = \eta \times W_{2L} \qquad \text{Expression 16}$$
$$= \eta \times (R_2 + r_0) \times I_{2L} \times I_{2L}$$

In Expression 16, $W_{2L}$ is the power receiving power when the induced current is $I_{2L}$.

On the other hand, when the induced current of the power receiving coil 220 when foreign matter is detected is set to $I_{2H}$, the power supply $W_{1H}$ required for generating $I_{2H}$ is calculated from the following Expression 17.

[Math 17]

$$W_{1H} = \eta \times W_{2H} \qquad \text{Expression 17}$$
$$= \eta \times (R_2 + r_2) \times I_{2H} \times I_{2H}$$

In Expression 17, $W_{2H}$ is the received power when the induced current is $I_{2H}$.

Based on Expression 16 and Expression 17, the control amount $\Delta W$ is calculated from the following Expression 18. The power supply efficiency estimated by the power receiving device 200 is sometimes different from an actual value or the power receiving device 200 sometimes cannot acquire the power supply efficiency itself. Then, the power receiving device 200 may transmit the ratio ($\Delta W/W_{2H}$) of $\Delta W$ to $W_{2H}$ or the value of $W_{2H} - W_{2L}$ to the power supply device 100 instead of $\Delta W$. The power supply device 100 may convert the received value to the $\Delta W$ based on Expressions 16 to 18, and may control the power supply amount.

[Math 18]

$$\Delta W = W_{1H} - W_{1L} \qquad \text{Expression 18}$$

[Example of Operation of Charge Device]

Charge control processing illustrated in FIG. 15 is different from that of Second embodiment in that Steps S962 to S964 are carried out instead of Step S955. When foreign matter is detected (Step S961: Yes), the power receiving device 200 calculates the control amount $\Delta W$ of the power supply amount from Expression 18 (Step S962). The power receiving device 200 transmits a control signal requesting to reduce the power supply amount by $\Delta W$ (Step S963). The power receiving device 200 controls a charging current according to $\Delta W$ (Step S964). The power receiving device 200 may not transmit a control signal to the power supply device 100 when the detection of foreign matter can be dealt with by controlling the charging current.

Figure 16:
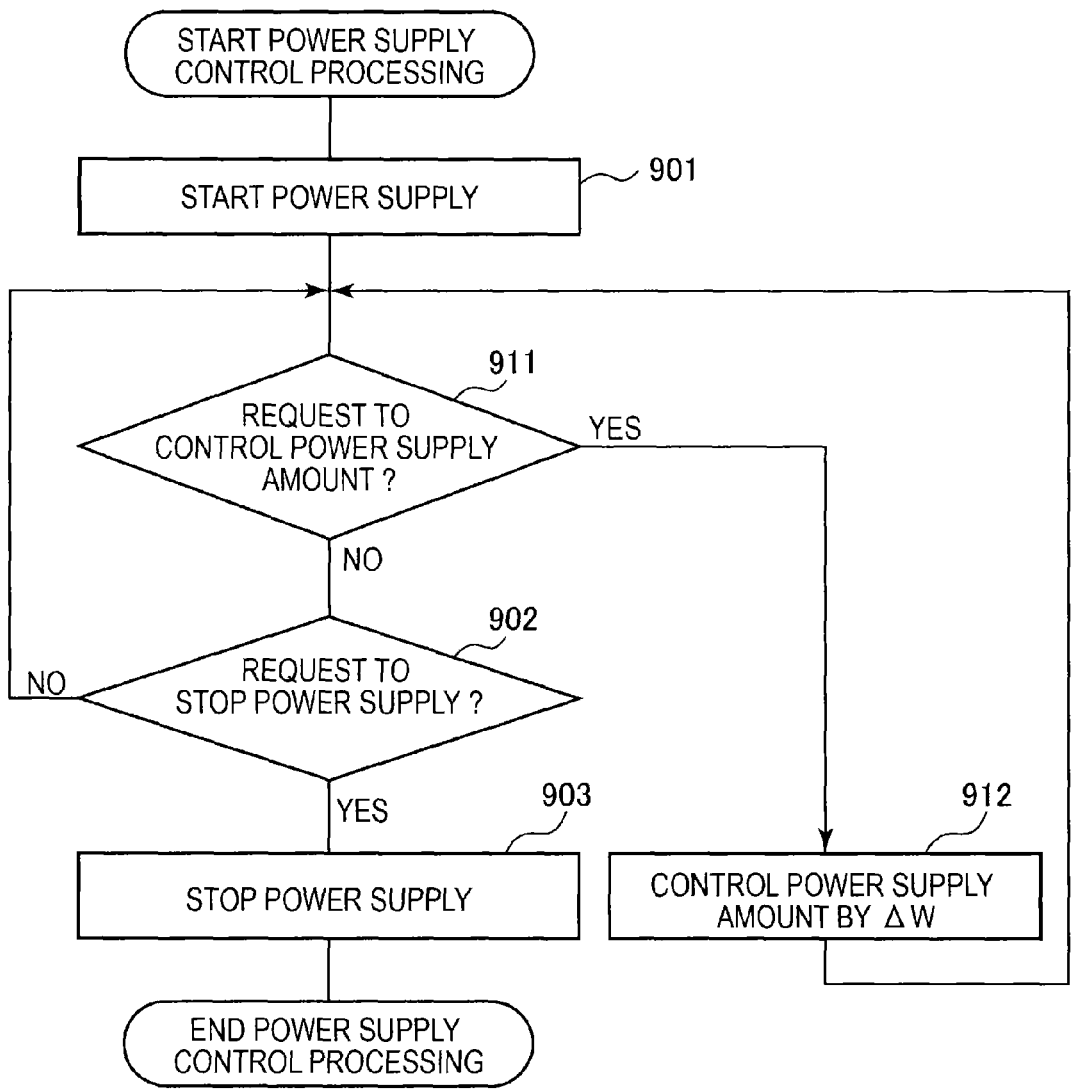
FIG. 16 is a flow chart illustrating one example of power supply control processing in Third embodiment.

FIG. 16 is a flow chart showing one example of power supply control processing in Third embodiment. The power supply control processing of Third embodiment is different from that of First embodiment in that Steps S911 and S912 are further carried out.

After the start of the power supply (Step S901), the power supply device 100 judges whether the control of the power supply amount is requested based on a control signal (Step S911). When there is the request of the control (Step S911: Yes), the power supply device 100 controls the power supply amount $\Delta W$ according to the control signal (Step S912). Then, the power supply device 100 returns to Step S911.

When there is no request of the control (Step S911: No), the power supply device 100 performs processing after Step S902.

Thus, according to Third embodiment of the present technique, the power receiving device 200 can detect foreign matter and also can calculate the control amount of the power amount. Thus, even when foreign matter is detected, the non-contact power supply system can continue the power supply with a suitable power amount.

<4. Fourth Embodiment>
[Configuration Example of Non-Contact Power Supply System]

Figure 17:
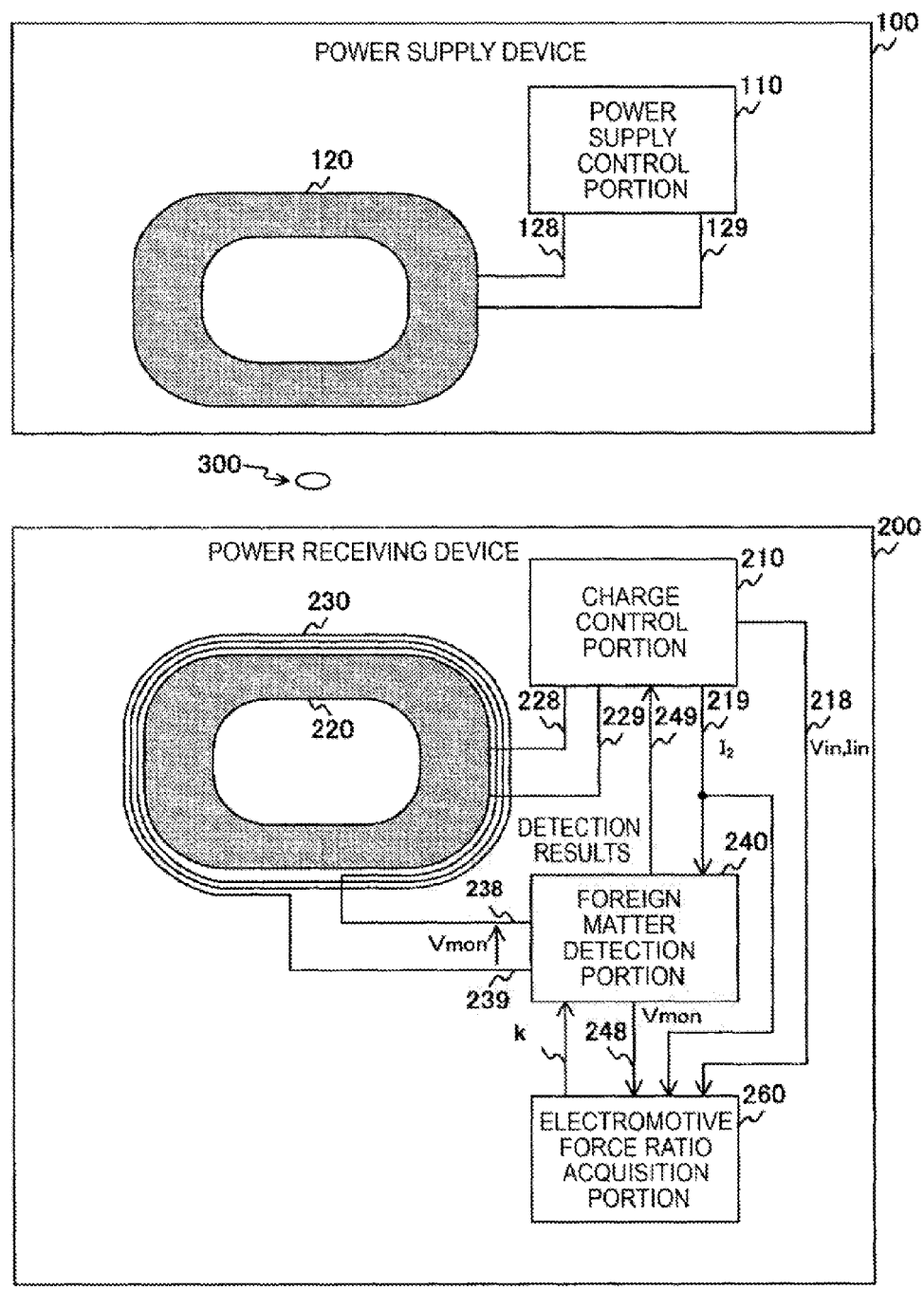
FIG. 17 is a general view illustrating one configuration example of a non-contact power supply system in Fourth embodiment.

FIG. 17 is a general view illustrating one configuration example of a non-contact power supply system in Fourth embodiment. In First embodiment, the impedance has been calculated based on the premise that the ratio (hereinafter referred to as "electromotive force ratio") between the induced voltage $V_{21}$ of the power receiving coil 220 and the induced voltage $V_{31}$ of the measurement coil 230 has been in agreement with the ratio of the number of turns of these coils. However, in actual, the electromotive force ratio k ($=V_{21}/V_{31}$) has not been in agreement with the ratio of the number of turns due to variations in the characteristics, position shift, and the like of the coils in manufacturing in some cases. Fourth embodiment is different from First embodiment in that the power receiving device 200 acquires a correct value of the electromotive force ratio k before the detection of foreign matter. Specifically, the non-contact power supply system of Fourth embodiment is different from that of First embodiment in that an electromotive force ratio acquisition portion 260 is further provided.

A charge control portion 210 of Fourth embodiment outputs an input voltage $V_{in}$, an input current $I_{in}$, and a secondary current $I_2$ to the electromotive force ratio acquisition portion 260 through signal lines 218 and 219. The input voltage $V_{in}$ is the voltage of the input terminal of a charge control circuit 213. The input current $I_{in}$ is a current which flows in a power receiving control circuit 213. A foreign matter detection portion 240 of Fourth embodiment outputs a monitoring induced voltage Vmon to the electromotive force ratio acquisition portion 260 through a signal line 248.

The electromotive force ratio acquisition portion 260 calculates a load resistance $R_2$ from the input voltage $V_{in}$ and the input current $I_{in}$. The electromotive force ratio acquisition portion 260 acquires at least two sets each containing the monitoring induced voltage Vmon, the secondary current $I_2$, and the load resistance $R_2$. The electromotive force ratio acquisition portion 260 substitutes the values of each set to the following equation 19, for example, to generate simultaneous linear equations, and then solve the same to thereby calculate the k value. The electromotive force ratio acquisition portion 260 may calculate the optimal k value using a least-squares method. The timing of calculating k is arbitrarily set, such as in factory shipment or repair, insofar as the timing is set before the start of the power supply.

[Math 19]

$$r_2 = Re\{k \times (\dot{V}_{mon}/\dot{I}_2)\} - R_2 \quad \text{Expression 19}$$

Expression 19 is one in which "$N_2/N_3$" of Expression 2 is replaced with the electromotive force ratio k. Expression 2 is an expression based on the premise that k is in agreement with "$N_2/N_3$" but K is not in agreement with "$N_2/N_3$" in some cases as described above. Therefore, it is desirable to calculate a correct k value by substituting Vmon, $I_2$, and $R_2$ of each set into Expression 19. The electromotive force ratio acquisition portion 260 outputs the calculated electromotive force ratio k to the foreign matter detection portion 240. The foreign matter detection portion 240 calculates a secondary resistance change amount $\Delta r_2$ using Expression 19 based on k.

Although it is configured so that the electromotive force ratio acquisition portion 260 is provided in the power receiving device 200, it can be configured so that the electromotive force ratio acquisition portion 260 is provided outside the power receiving device 200. The power receiving device 200 of Fourth embodiment can also be configured so that the foreign matter detection portion 240 is not provided when acquiring the electromotive force ratio.

[Configuration Example of Charge Control Portion]

Figure 18:
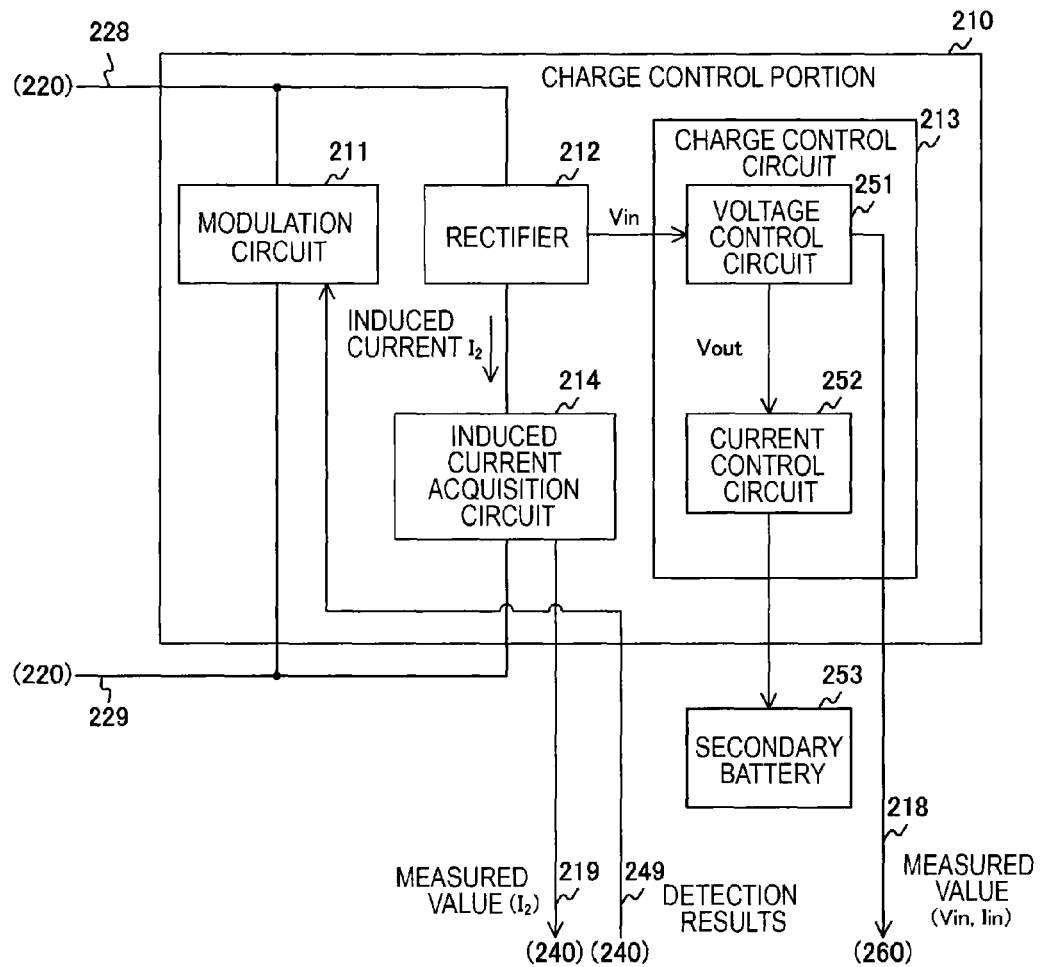
FIG. 18 is a block diagram illustrating one configuration example of a charge control portion in Fourth embodiment.

FIG. 18 is a block diagram illustrating one configuration example of a charge control portion 210 in Fourth embodiment. The charge control circuit 213 of Fourth embodiment has a voltage control circuit 251 and a current control circuit 252. To the charge control circuit 213, a secondary battery 253 is connected.

The voltage control circuit 251 controls a direct-current voltage using a series regulator or the like which controls an output voltage to a constant value, for example. The voltage control circuit 251 measures the voltage and the current of the input terminal of the series regulator as an input voltage $V_{in}$ and an input current $I_{in}$, and then outputs the measured values to the electromotive force ratio acquisition portion 260, for example. The current control circuit 252 supplies power to a secondary battery 253 for charging and also controls a charging current. The charging current is controlled according to the characteristics, the charging time, and the like of the secondary battery 253. The secondary battery 253 stores the power supplied from the current control circuit 252.

In order to measure a plurality of $V_{in}$ and $I_{in}$ whose values are different from each other, a modulation circuit 211 may output a control signal requesting to change the power supply amount to the modulation circuit 211 when measuring the electromotive force ratio. Thus, a plurality of $V_{in}$ and $I_{in}$ are efficiently measured.

[Configuration Example of Electromotive Force Ratio Acquisition Portion]

Figure 19:
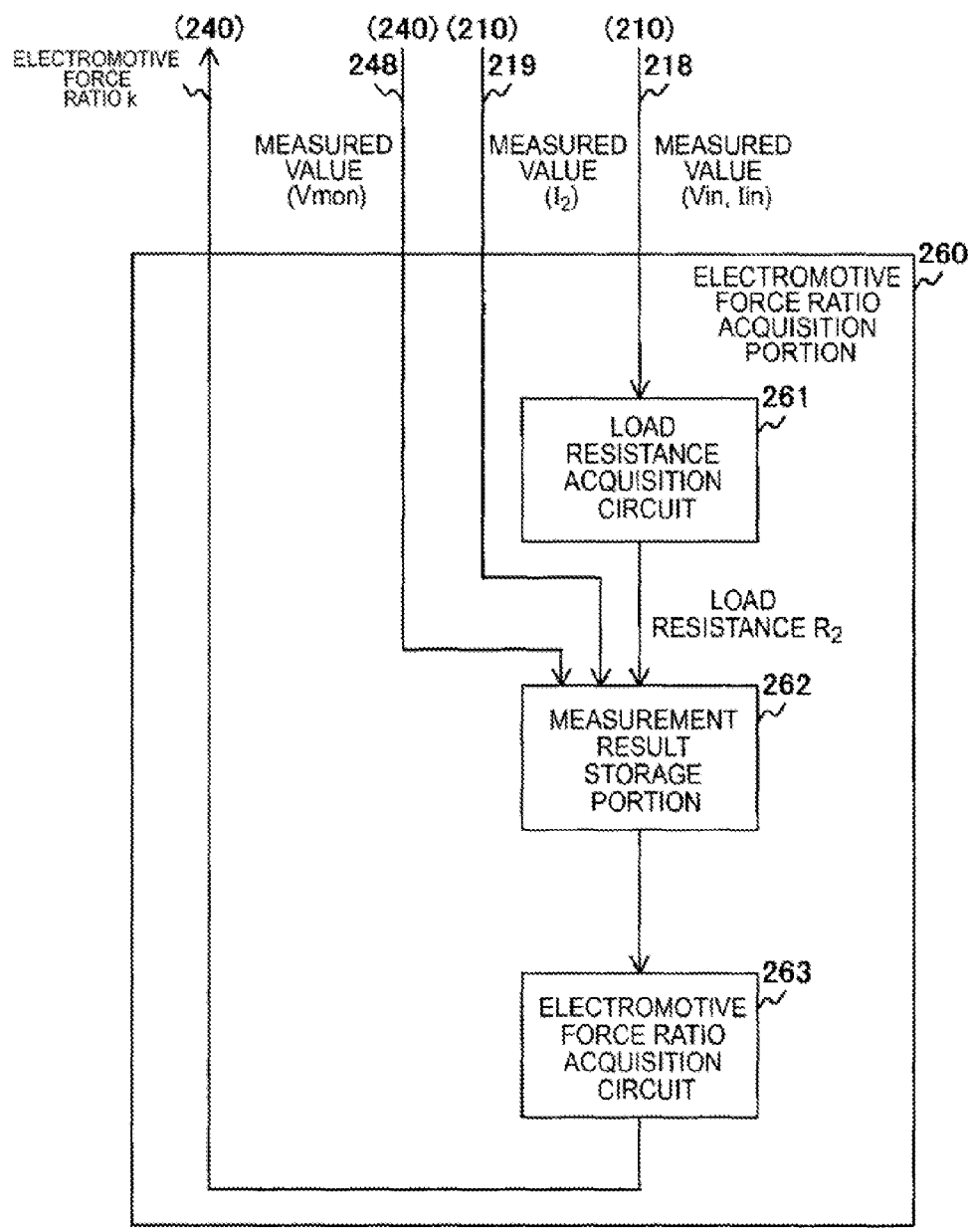
FIG. 19 is a block diagram illustrating one configuration example of an electromotive force ratio acquisition portion in Fourth embodiment.

FIG. 19 is a block diagram illustrating one configuration example of the electromotive force ratio acquisition portion 260 in Fourth embodiment. The electromotive force ratio acquisition portion 260 has a load resistance acquisition circuit 261, a measurement result storage portion 262, and an electromotive force ratio acquisition circuit 263.

The load resistance acquisition circuit 261 acquires a load resistance $R_2$. The load resistance acquisition circuit 261 receives the input voltage $V_{in}$ and the input current $I_{in}$ from the charge control portion 210. Then, the load resistance acquisition circuit 261 calculates the resistance of the series regulator from the output voltage $V_{out}$, the input voltage $V_{in}$, and the input current $I_{in}$ of the series regulator acquired beforehand. The load resistance acquisition circuit 261 adds the resistance of the series regulator and the resistance of loads other than the series regulator acquired beforehand to calculate the load resistance $R_2$ of the entire load. The load resistance acquisition circuit 261 stores the calculated load resistance $R_2$ in the measurement result storage portion 262.

The measurement result storage portion 262 stores a plurality of sets each containing the monitoring induced voltage Vmon, the secondary current $I_2$, and the load resistance $R_2$. The electromotive force ratio acquisition circuit 263 acquires the electromotive force ratio k from the measured values of each set and Expression 19. The electromotive force ratio acquisition circuit 263 outputs the calculated electromotive force ratio k to the secondary resistance change amount acquisition circuit 242 in the foreign matter detection portion 240. The measurement result storage portion 262 is one example of a storage portion described in Claims.

Although it is configured so that the electromotive force ratio acquisition portion 260 acquires a plurality of load resistances $R_2$ from the plurality of input voltages $V_{in}$ and $I_{in}$, the present technique is not limited to the configuration insofar as a plurality of load resistances $R_2$ can be acquired. For example, a connection control portion which controls additional application of a load to the charge control portion 210 for connection may be further provided in the power receiving device 200. In this configuration, when the start of the measurement of the electromotive force ratio is directed by a worker's operation or the like, the connection control portion connects a load to the charge control portion 210 in series or in parallel and also outputs a signal, which notifies that the load is connected, to the electromotive force ratio acquisition portion 260. In the measurement result storage portion 262, the load resistances $R_2$ before and after the connection and Vmon and $I_2$ before the connection are stored beforehand. After receiving the notification that the load is connected, the electromotive force ratio acquisition portion 260 acquires Vmon and $I_2$ after the connection, and then calculates k from Vmon, $I_2$, and $R_2$ before and after the connection.

Figure 20:
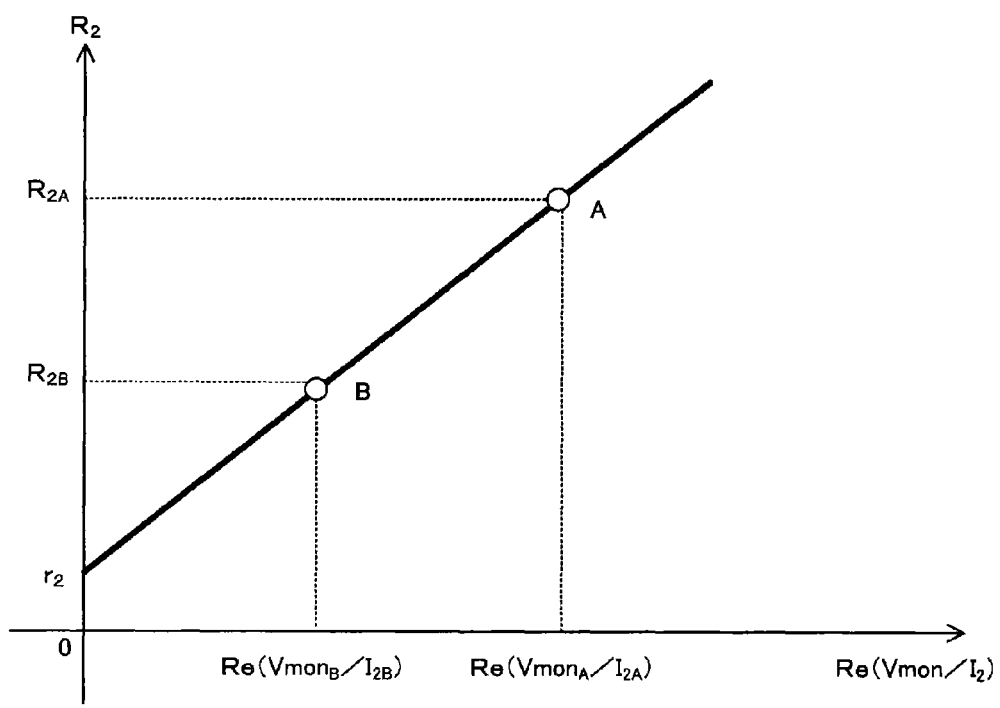
FIG. 20 is a graph showing one example of the relationship between a monitoring induced voltage and an induced current with a secondary resistance in Fourth Embodiment.

FIG. 20 is a graph showing one example of the relationship between the monitoring induced voltage Vmon and the induced current $I_2$ with the load resistance $R_2$ in Fourth embodiment. In FIG. 20, the vertical axis represents "$R_2$" and the horizontal axis represents "Re (Vmon/$I_2$)." The point A is the measurement point plotted based on $R_{2A}$, $Vmon_A$, and $I_{2A}$ measured at a received power $W_A$. The point B is the measurement point plotted based on $R_{2B}$, $Vmon_B$, and $I_{2B}$ measured at a received power $W_B$. The gradient of the straight line connecting the point A and the point B is equivalent to the electromotive force ratio k in Expression 19. The intercept of the straight line is equivalent to the secondary resistance $r_2$. Since a measurement error arises in some cases, k may be determined using a least-squares method for determining k in which the sum of squares E of a difference $d_x$ between $R_{2x}$ obtained from each measurement point and $R_{2x}'$ obtained from $Vmon_x$ and $I_{2x}$ of each measurement point by Expression 19 is the minimum.

Thus, according to Fourth embodiment of the present technique, the power receiving device 200 can acquire a correct value of the electromotive force ratio k from Vmon, $I_2$, and $R_2$. Thus, foreign matter is more correctly detected.

<4. Fifth Embodiment>
[Configuration Example of Foreign Matter Detection Portion]

Figure 21:
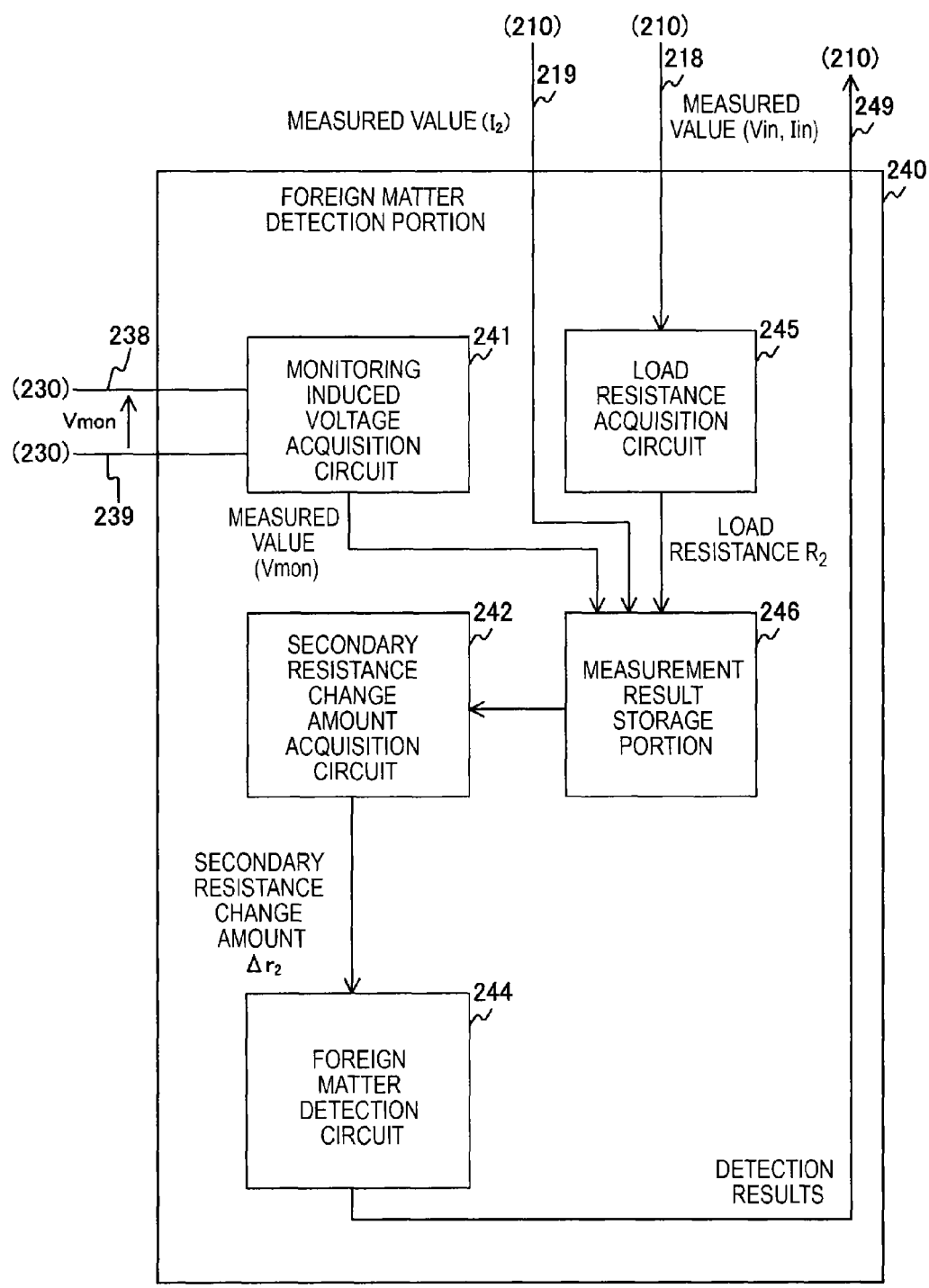
FIG. 21 is a block diagram illustrating one configuration example of a foreign matter detection portion in Fifth embodiment.

FIG. 21 is a block diagram illustrating one configuration example of a foreign matter detection portion 240 in Fifth embodiment. In First embodiment, the foreign matter detection portion 240 calculates the impedance based on the premise that the electromotive force ratio k is constant. However, as described in Fourth embodiment, k is not always constant. The foreign matter detection portion 240 of Fifth embodiment is different from that of First embodiment in that $\Delta r_2$ is calculated without the use of k. A charge control portion 210 of Fifth embodiment has the same configuration as that of Fourth embodiment and measures an input voltage $V_{in}$ and an input current $I_{in}$ during charging, and then outputs the measured values to the foreign matter detection portion 240. The foreign matter detection portion 240 of Fifth embodiment is different from that of First embodiment in having a load resistance acquisition circuit 245 and a measurement result storage portion 246 and not having a secondary inductance change amount acquisition circuit 243.

In order to measure a plurality of $V_{in}$ and $I_{in}$ whose values are different from each other, a charge control portion 210 of Fifth embodiment may transmit a control signal requesting to change the power supply amount to the power supply circuit 100 during charging. Thus, a plurality of $V_{in}$ and $I_{in}$ are efficiently measured.

The configuration of a load resistance acquisition circuit 245 is the same as that of the load resistance acquisition circuit 261 of Fourth embodiment. The configuration of a measurement result storage portion 246 is the same as that of the measurement result storage portion 262 of Fourth embodiment. A secondary resistance change amount acquisition circuit 242 in Fifth embodiment determines $\Delta r_2$ from the measurement results. In FIG. 20, by substituting at least two sets of the measurement results into Expression 19, $r_2$ is determined even when k is unknown as described above. Specifically, the intercept of the straight line illustrated in FIG. 20 is equal to $r_2$. The secondary resistance change amount acquisition circuit 242 calculates $\Delta r_2$ from the determined $r_2$ using Expression 3, and then outputs the same.

Thus, according to Fifth embodiment of the present technique, the power receiving device 200 can acquire a correct impedance change amount from Vmon, $I_2$, and $R_2$. Thus, even when the k value fluctuates, foreign matter is more correctly detected.

The above-described embodiments describe one example for embodying the present technique, and there is a correspondence between the matter in the embodiments and the matter specifying the present invention in the scope of claims. Likewise, there is a correspondence between the matter specifying the present invention in the scope of claims and the matter having the same name in the embodiments of the present technique. The present technique, however, is not limited to the embodiments, and can be embodied by making various modifications to the embodiments without departing from the gist of the technique.

Further, the procedures described in the above-described embodiments may be understood as a method including a series of these procedures, and may be understood as a program for causing a computer to execute the series of these procedures or a recording medium storing the program therein. As the recording medium, for example, a CD (a Compact Disc), an MD (a Mini Disc), a DVD (a Digital Versatile Disk), a memory card, a Blu-ray Disc (Registered trademark), and the like can be used.

Additionally, the present technology may also be configured as below.

(1)
A power receiving device including:
a power receiving coil which receives power supplied by electromagnetic waves; and
a measurement coil which is disposed near the power receiving coil and measures an electromagnetic field.

(2)
The power receiving device according to (1),
wherein the measurement coil is disposed in a manner that a same magnetic flux as a magnetic flux of the electromagnetic field passing through a coil surface of the power receiving coil passes.

(3)
The power receiving device according to (2),
wherein the measurement coil is a coil in which a current does not substantially flow.

(4)

The power receiving device according to any one of (3), wherein a number of turns of the measurement coil is different from a number of turns of the power receiving coil.

(5)

The power receiving device according to any one of (1) to (4), further including:

a voltage acquisition circuit which acquires an induced voltage of the measurement coil generated in the measured electromagnetic field; and a current acquisition circuit which acquires an induced current of the power receiving coil generated in the measured electromagnetic field.

(6)

The power receiving device according to (5), further including:

a detection circuit which detects presence or absence of foreign matter which hinders power reception by the electromagnetic waves from the induced voltage and the induced current.

(7)

The power receiving device according to (6), further including:

a charge control circuit which controls a charging current according to the foreign matter detection result.

(8)

The power receiving device according to (6), wherein the detection circuit acquires a parameter fluctuating in the power receiving coil from the induced voltage and the induced current to thereby detect presence or absence of the foreign matter.

(10)

The power receiving device according to 5, further including:

a transmitting circuit for transmitting a signal to a power supply device which supplies the power according to the induced voltage and the induced current.

(11)

(11)

The power receiving device according to 10, wherein the signal is a signal which adjusts an amount of electromagnetic waves supplied from the power supply device.

(12)

The power receiving device according to any one of (1) to (11), further including:

a load resistance acquisition circuit which acquires a resistance of a load connected to the power receiving coil; and a storage portion which stores the induced voltage, the induced current, and the resistance.

(13)

The power receiving device according to (12), further including:

a detection circuit which detects presence or absence of foreign matter which hinders power reception by the electromagnetic waves from the induced voltage and the induced current.

(14)

The power receiving device according to (13), further including:

a charge control circuit which controls a charging current according to the foreign matter detection result.

(15)

The power receiving device according to (13) or (14), wherein the detection circuit acquires a parameter fluctuating in the power receiving coil from the induced voltage of the measurement coil and the induced current of the power receiving coil to thereby detect presence or absence of the foreign matter.

(16)

The power receiving device according to (15), wherein the parameter is an impedance of the power receiving coil or an inductance of the power receiving coil.

(17)

An electric circuit for use in a power receiving device which receives power supplied by electromagnetic waves, the electric circuit including:

a power receiving coil which receives power supplied by the electromagnetic waves; and a measurement coil which is disposed near the power receiving coil, wherein the electric circuit measures an induced voltage generated in the measurement coil.

(18)

The power receiving device according to (17), wherein the measurement coil is a coil in which a current does not substantially flow.

(19)

A power supply device, including:

a power supply coil which supplies power to a power receiving device according to a signal transmitted by the power receiving device, the power receiving device including:

a power receiving coil which receives power supplied by electromagnetic waves;

a measurement coil which is disposed near the power receiving coil and in which a current does not substantially flow;

a circuit which measures a voltage generated in the measurement coil; and a transmitting circuit for transmitting the signal for adjusting an electromagnetic wave amount according to the measured voltage.

(20)

The power receiving device according to (19), wherein the measurement coil is a coil in which a current does not substantially flow.

REFERENCE SIGNS LIST 100 power supply device
110 power supply control portion
111 demodulation circuit
112 power supply control circuit
120 supply coil
121 primary inductance
122 primary capacitance
200 power receiving device
210 charge control portion
211 modulation circuit
212 rectifier
213 charge control circuit
214 induced current acquisition circuit
215 load resistance
220 power receiving coil
221 secondary inductance
215 secondary capacitance
230 measurement coil
231 inductance
240 foreign matter detection portion
241 monitoring induced voltage acquisition circuit
242 secondary resistance change amount acquisition circuit
243 secondary inductance change amount acquisition circuit 244 foreign matter detection circuit
245 load resistance acquisition circuit
246 measurement result storage portion
251 voltage control circuit
252 current control circuit
253 secondary battery
260 electromotive force ratio acquisition portion
261 load resistance acquisition circuit
262 measurement result storage portion
263 electromotive force ratio acquisition circuit
300 foreign matter

The invention claimed is:

1. A power receiving device, comprising:
a power receiving coil configured to receive power supplied by electromagnetic waves; and
a measurement coil which is present at a determined proximity to the power receiving coil and is configured to measure an electromagnetic field that passes through the power receiving coil, wherein the measurement coil is a coil in which a flow of current is substantially zero.

2. The power receiving device according to claim 1, wherein the measurement coil is present such that a first magnetic flux of the electromagnetic field that passes through the measurement coil is equal to a second magnetic flux of the electromagnetic field that passes through a coil surface of the power receiving coil.

3. The power receiving device according to claim 2, wherein a number of turns of the measurement coil is different from a number of turns of the power receiving coil.

4. The power receiving device according to claim 1, further comprising:
a voltage acquisition circuit configured to acquire an induced voltage of the measurement coil generated in the measured electromagnetic field; and
a current acquisition circuit configured to acquire an induced current of the power receiving coil generated in the measured electromagnetic field.

5. The power receiving device according to claim 4, further comprising
a detection circuit configured to detect a presence or an absence of a foreign matter which hinders power reception by the electromagnetic waves from the induced voltage and the induced current.

6. The power receiving device according to claim 5, further comprising a charge control circuit configured to control a charging current based on the foreign matter detection result.

7. The power receiving device according to claim 5, wherein the detection circuit is further configured to acquire a parameter that fluctuates in the power receiving coil from the induced voltage and the induced current to thereby detect the presence or the absence of the foreign matter.

8. The power receiving device according to claim 7, wherein the parameter is an impedance of the power receiving coil or an inductance of the power receiving coil.

9. The power receiving device according to claim 4, further comprising
a transmitting circuit configured to transmit a signal to a power supply device is further configured to supply the power based on to the induced voltage and the induced current.

10. The power receiving device according to claim 9, wherein the signal is a signal which adjusts an amount of electromagnetic waves supplied from the power supply device.

11. The power receiving device according to claim 1, further comprising:

a load resistance acquisition circuit configured to acquire a resistance of a load connected to the power receiving coil; and
a storage portion configured to store an induced voltage, an induced current, and the resistance.

12. The power receiving device according to claim 11, further comprising
a detection circuit configured to detect a presence or an absence of a foreign matter which hinders power reception by the electromagnetic waves from the induced voltage and the induced current.

13. The power receiving device according to claim 12, further comprising
a charge control circuit configured to control a charging current based on the foreign matter detection result.

14. The power receiving device according to claim 12, wherein the detection circuit is further configured to acquire a parameter that fluctuates in the power receiving coil from the induced voltage of the measurement coil and the induced current of the power receiving coil to thereby detect the presence or the absence of the foreign matter.

15. The power receiving device according to claim 14, wherein the parameter is an impedance of the power receiving coil or an inductance of the power receiving coil.

16. An electric circuit for use in a power receiving device, the electric circuit comprising:
a power receiving coil configured to receive power supplied by electromagnetic waves; and
a measurement coil present at a determined proximity to the power receiving coil,
wherein the electric circuit is configured to measure an induced voltage generated in the measurement coil.

17. The electronic circuit according to claim 16, wherein the measurement coil is a coil in which a flow of current is substantially zero.

18. A power supply device, comprising:
a power supply coil configured to supply power to a power receiving device based on a signal transmitted by the power receiving device, the power receiving device including:
a power receiving coil configured to receive power supplied by electromagnetic waves;
a measurement coil which is present at a determined proximity to the power receiving coil and in which a flow of current is substantially zero;
a circuit is configured to measure a voltage generated in the measurement coil; and
a transmitting circuit configured to transmit the signal to adjust an amount of electromagnetic wave based on the measured voltage.

19. The power receiving device according to claim 18, wherein the measurement coil is a coil in which a current is prevented to flow.

20. A power receiving device, comprising:
a power receiving coil configured to receive power supplied by electromagnetic waves;
a measurement coil present at a determined proximity to the power receiving coil and is configured to measure an electromagnetic field that passes through the power receiving coil;
a load resistance acquisition circuit configured to acquire a resistance of a load connected to the power receiving coil; and
a storage portion configured to store an induced voltage, an induced current, and the resistance.

* * * * *